US011852481B2

(12) United States Patent
Boysel et al.

(10) Patent No.: US 11,852,481 B2
(45) Date of Patent: Dec. 26, 2023

(54) MEMS MOTION SENSOR AND METHOD OF MANUFACTURING

(71) Applicant: Motion Engine Inc., Tokyo (JP)

(72) Inventors: Robert Mark Boysel, Delaware, OH (US); Louis Ross, Tokyo (JP)

(73) Assignee: Motion Engine Inc., Montreal (CA)

( * ) Notice: Subject to any disclaimer, the term of this patent is extended or adjusted under 35 U.S.C. 154(b) by 0 days.

(21) Appl. No.: 14/622,548

(22) Filed: Feb. 13, 2015

(65) Prior Publication Data

US 2015/0260519 A1   Sep. 17, 2015

Related U.S. Application Data

(63) Continuation-in-part of application No. PCT/CA2014/050730, filed on Aug. 1, 2014.
(Continued)

(51) Int. Cl.
*G01C 19/5712* (2012.01)
*G01C 19/5755* (2012.01)
*G01C 19/5769* (2012.01)

(52) U.S. Cl.
CPC ..... *G01C 19/5712* (2013.01); *G01C 19/5755* (2013.01); *G01C 19/5769* (2013.01)

(58) Field of Classification Search
CPC .............. G01C 19/56; G01C 19/5712; G01C 19/5755; G01C 19/5769; H01L 29/84;
(Continued)

(56) References Cited

U.S. PATENT DOCUMENTS

| 4,430,895 A | 2/1984 | Colton |
| 4,483,194 A | 11/1984 | Rudolf |
| (Continued) | | |

FOREIGN PATENT DOCUMENTS

| CN | 103350983 A | 10/2013 |
| EP | 1802952 A1 | 7/2007 |
| (Continued) | | |

OTHER PUBLICATIONS

A Single-Proof-Mass MEMS Multi-Axis Motion Sensor by Dr. Mark Boysel, Semicon Japan 2008.
(Continued)

*Primary Examiner* — Tuan A Hoang
(74) *Attorney, Agent, or Firm* — McCarter & English, LLP

(57) ABSTRACT

A MEMS motion sensor and its manufacturing method are provided. The sensor includes a MEMS wafer including a proof mass and flexible springs suspending the proof mass and enabling the proof mass to move relative to an outer frame along mutually orthogonal x, y and z axes. The sensor includes top and bottom cap wafers including top and bottom cap electrodes forming capacitors with the proof mass, the electrodes being configured to detect a motion of the proof mass. Electrical contacts are provided on the top cap wafer, some of which are connected to the respective top cap electrodes, while others are connected to the respective bottom cap electrodes by way of insulated conducting pathways, extending along the z axis from one of the respective bottom cap electrodes and upward successively through the bottom cap wafer, the outer frame of the MEMS wafer and the top cap wafer.

51 Claims, 15 Drawing Sheets

Related U.S. Application Data

(60) Provisional application No. 61/861,821, filed on Aug. 2, 2013, provisional application No. 61/861,786, filed on Aug. 2, 2013.

(58) Field of Classification Search
CPC .. G01P 15/14; G01P 15/18; B81B 2201/0235; B81B 7/007
USPC .......................................... 257/774; 438/106
See application file for complete search history.

(56) References Cited

U.S. PATENT DOCUMENTS

| | | |
|---|---|---|
| 4,553,436 A | 11/1985 | Hansson |
| 4,590,801 A | 5/1986 | Merhav |
| 4,592,233 A | 6/1986 | Peters |
| 4,805,456 A | 2/1989 | Howe |
| 4,833,417 A | 5/1989 | Schroeder |
| 4,881,408 A | 11/1989 | Hulsing |
| 4,882,933 A | 11/1989 | Petersen |
| 4,905,523 A | 3/1990 | Okada |
| 4,967,605 A | 11/1990 | Okada |
| 5,177,661 A | 1/1993 | Zavracky et al. |
| 5,235,457 A | 8/1993 | Lichtman et al. |
| 5,239,984 A | 8/1993 | Cane et al. |
| 5,359,893 A | 11/1994 | Dunn |
| 5,557,046 A | 9/1996 | Hulsing |
| 5,596,144 A | 1/1997 | Swanson |
| 5,608,210 A | 3/1997 | Esparza et al. |
| 5,614,742 A | 3/1997 | Gessner |
| 5,623,270 A | 4/1997 | Kempkes et al. |
| 5,635,639 A | 6/1997 | Greiff et al. |
| 5,646,346 A | 7/1997 | Okada |
| 5,662,111 A | 9/1997 | Cosman |
| 5,777,226 A * | 7/1998 | Ip ............................ G01P 15/02 73/514.24 |
| 5,831,163 A | 11/1998 | Okada |
| 5,894,090 A | 4/1999 | Tang |
| 5,895,850 A | 4/1999 | Buestgens |
| 5,898,223 A | 4/1999 | Frye |
| 5,920,011 A | 7/1999 | Hulsing |
| 5,959,206 A | 9/1999 | Ryrko |
| 5,962,784 A | 10/1999 | Hulsing |
| 5,977,640 A | 11/1999 | Bertin |
| 5,987,985 A * | 11/1999 | Okada .................... G01C 19/56 73/504.04 |
| 5,992,233 A | 11/1999 | Clark |
| 6,003,371 A | 12/1999 | Okada |
| 6,028,773 A | 2/2000 | Hundt |
| 6,053,057 A | 4/2000 | Okada |
| 6,058,778 A | 5/2000 | Chan |
| 6,079,272 A | 6/2000 | Stell |
| 6,090,638 A | 7/2000 | Vigna |
| 6,091,132 A | 7/2000 | Bryant |
| 6,119,517 A | 9/2000 | Breng |
| 6,122,961 A | 9/2000 | Geen |
| 6,159,773 A | 12/2000 | Lin |
| 6,184,052 B1 | 2/2001 | Vigna |
| 6,225,699 B1 | 5/2001 | Ference |
| 6,235,550 B1 | 5/2001 | Chan |
| 6,257,057 B1 | 7/2001 | Hulsing |
| 6,282,956 B1 | 9/2001 | Okada |
| 6,295,870 B1 | 10/2001 | Hulsing |
| 6,391,673 B1 | 5/2002 | Ha |
| 6,399,997 B1 | 6/2002 | Lin |
| 6,469,330 B1 | 10/2002 | Vigna |
| 6,487,000 B2 | 11/2002 | Mastromatteo |
| 6,490,923 B1 | 12/2002 | Breng |
| 6,508,124 B1 | 1/2003 | Zerbini |
| 6,539,801 B1 | 4/2003 | Gutierrez |
| 6,584,845 B1 | 7/2003 | Gutierrez |
| 6,587,312 B2 | 7/2003 | Murari |
| 6,621,137 B1 | 9/2003 | Ma |
| 6,651,500 B2 | 11/2003 | Stewart |
| 6,675,630 B2 | 1/2004 | Challoner |
| 6,696,364 B2 | 2/2004 | Gelmi |
| 6,701,786 B2 | 3/2004 | Hulsing |
| 6,705,167 B2 | 3/2004 | Kvisteroey |
| 6,715,353 B2 | 4/2004 | Johnson |
| 6,718,823 B2 | 4/2004 | Platt |
| 6,766,689 B2 | 7/2004 | Durante |
| 6,772,632 B2 | 8/2004 | Okada |
| 6,808,952 B1 | 10/2004 | Sniegowski et al. |
| 6,808,955 B2 | 10/2004 | Ma |
| 6,829,937 B2 | 12/2004 | Mahon |
| 6,841,861 B2 | 1/2005 | Brady |
| 6,856,144 B2 | 2/2005 | Lasalandra |
| 6,863,832 B1 | 3/2005 | Wiemer |
| 6,865,943 B2 | 3/2005 | Okada |
| 6,892,575 B2 | 5/2005 | Nasiri |
| 6,925,875 B2 | 8/2005 | Silverbrook |
| 6,939,473 B2 | 9/2005 | Nasiri |
| 6,942,750 B2 | 9/2005 | Chou |
| 6,944,931 B2 | 9/2005 | Shcheglov |
| 6,953,985 B2 | 10/2005 | Lin |
| 6,978,673 B2 | 12/2005 | Johnson et al. |
| 6,990,863 B2 | 1/2006 | Challoner |
| 6,991,957 B2 | 1/2006 | Eskridge |
| 6,993,617 B2 | 1/2006 | Butcher |
| 7,017,410 B2 | 3/2006 | Challoner |
| 7,040,163 B2 | 5/2006 | Shcheglov |
| 7,043,985 B2 | 5/2006 | Ayazi |
| 7,056,757 B2 | 6/2006 | Ayazi |
| 7,093,486 B2 | 8/2006 | Challoner |
| 7,100,448 B2 | 9/2006 | Ikegami |
| 7,104,129 B2 | 9/2006 | Nasiri |
| 7,138,694 B2 | 11/2006 | Nunan |
| 7,159,441 B2 | 1/2007 | Challoner |
| 7,160,752 B2 | 1/2007 | Ouellet et al. |
| 7,168,317 B2 | 1/2007 | Chen et al. |
| 7,168,318 B2 | 1/2007 | Challoner |
| 7,176,556 B2 | 2/2007 | Okamoto |
| 7,180,019 B1 | 2/2007 | Chiou |
| 7,210,351 B2 | 5/2007 | Lo |
| 7,217,588 B2 | 5/2007 | Hartzell |
| 7,238,999 B2 | 7/2007 | LaFond |
| 7,247,246 B2 | 7/2007 | Nasiri |
| 7,250,112 B2 | 7/2007 | Nasiri |
| 7,250,353 B2 | 7/2007 | Nasiri |
| 7,258,008 B2 | 8/2007 | Durante |
| 7,258,011 B2 | 8/2007 | Nasiri |
| 7,258,012 B2 | 8/2007 | Xie |
| 7,275,424 B2 | 10/2007 | Felton |
| 7,291,561 B2 | 11/2007 | Ma |
| 7,318,349 B2 | 1/2008 | Vaganov |
| 7,322,236 B2 | 1/2008 | Combi |
| 7,322,237 B2 | 1/2008 | Kutsuna |
| 7,337,671 B2 * | 3/2008 | Ayazi .................. G01P 15/0802 73/514.32 |
| 7,347,095 B2 | 3/2008 | Shcheglov |
| 7,360,423 B2 | 4/2008 | Ayazi |
| 7,402,905 B2 | 7/2008 | Eskridge et al. |
| 7,417,329 B2 | 8/2008 | Chuang |
| 7,442,570 B2 | 8/2008 | Chuang |
| 7,458,263 B2 | 12/2008 | Nasiri |
| 7,484,410 B2 | 2/2009 | Tsuji |
| 7,491,567 B2 | 2/2009 | DCamp |
| 7,518,493 B2 | 4/2009 | Bryzek et al. |
| 7,541,588 B2 | 6/2009 | Tabirian et al. |
| 7,543,496 B2 | 6/2009 | Ayazi |
| 7,578,189 B1 | 8/2009 | Mehregany |
| 7,615,406 B2 | 11/2009 | Higashi |
| 7,617,729 B2 | 11/2009 | Axelrod et al. |
| 7,621,183 B2 | 11/2009 | Seeger |
| 7,624,494 B2 | 12/2009 | Challoner |
| 7,642,115 B2 | 1/2010 | Eriksen et al. |
| 7,642,657 B2 | 1/2010 | Suilleabhain |
| 7,677,099 B2 | 3/2010 | Nasiri |
| 7,684,101 B2 | 3/2010 | Border et al. |
| 7,689,321 B2 | 3/2010 | Karlsson |
| 7,690,254 B2 | 4/2010 | Pilchowski et al. |
| 7,694,563 B2 | 4/2010 | Durante |
| 7,748,272 B2 | 7/2010 | Kranz |
| 7,755,367 B2 | 7/2010 | Schoen |

(56) References Cited

U.S. PATENT DOCUMENTS

| | | |
|---|---|---|
| 7,767,483 B1 | 8/2010 | Waters |
| 7,767,484 B2 * | 8/2010 | Ayazi ................ B81C 1/00285 |
| | | 438/52 |
| 7,784,344 B2 | 8/2010 | Pavelescu |
| 7,786,572 B2 | 8/2010 | Chen |
| 7,790,608 B2 | 9/2010 | Lauxtermann et al. |
| 7,795,723 B2 | 9/2010 | Chau et al. |
| 7,810,379 B2 | 10/2010 | DeNatale et al. |
| 7,851,898 B2 | 12/2010 | Nakamura |
| 7,863,698 B2 | 1/2011 | Seeger |
| 7,875,942 B2 | 1/2011 | Cortese |
| 7,882,740 B2 | 2/2011 | Okada |
| 7,886,601 B2 | 2/2011 | Merassi |
| 7,898,043 B2 | 3/2011 | Ziglioli |
| 7,908,921 B2 | 3/2011 | Binda |
| 7,928,632 B2 | 4/2011 | Yang |
| 7,929,143 B2 | 4/2011 | Wilfinger et al. |
| 7,934,423 B2 | 5/2011 | Nasiri |
| 7,964,428 B2 | 6/2011 | Breng |
| 7,971,483 B2 | 7/2011 | Supino et al. |
| 7,982,291 B2 | 7/2011 | Kuisma |
| 7,982,558 B2 * | 7/2011 | Sworowski ......... B81C 1/00198 |
| | | 333/186 |
| 7,987,714 B2 | 8/2011 | DeNatale et al. |
| 8,042,394 B2 | 10/2011 | Coronato |
| 8,047,075 B2 | 11/2011 | Nasiri |
| 8,049,515 B2 | 11/2011 | Schoen |
| 8,069,726 B2 | 12/2011 | Seeger |
| 8,071,398 B1 | 12/2011 | Yang |
| 8,077,372 B2 | 12/2011 | Border et al. |
| 8,080,869 B2 | 12/2011 | Okudo |
| 8,084,332 B2 | 12/2011 | Nasiri |
| 8,100,012 B2 | 1/2012 | Martin |
| 8,124,895 B2 | 2/2012 | Merassi |
| 8,134,214 B2 | 3/2012 | Baldo |
| 8,151,640 B1 | 4/2012 | Kubena |
| 8,166,816 B2 | 5/2012 | Ayazi et al. |
| 8,176,782 B2 | 5/2012 | Furukubo |
| 8,220,328 B2 | 7/2012 | Rudolf et al. |
| 8,227,285 B1 | 7/2012 | Yang |
| 8,227,911 B1 | 7/2012 | Yang |
| 8,230,740 B2 | 7/2012 | Katsuki et al. |
| 8,236,577 B1 | 8/2012 | Hsu |
| 8,258,590 B2 | 9/2012 | Geiger |
| 8,272,266 B2 | 9/2012 | Zhang |
| 8,283,737 B2 | 9/2012 | Sugizaki |
| 8,289,092 B2 | 10/2012 | Pomarico |
| 8,297,121 B2 | 10/2012 | Quer et al. |
| 8,314,483 B2 | 11/2012 | Lin |
| 8,324,047 B1 | 12/2012 | Yang |
| 8,347,717 B2 | 1/2013 | Seeger |
| 8,350,346 B1 | 1/2013 | Huang |
| 8,365,595 B2 | 2/2013 | Geiger |
| 8,368,153 B2 | 2/2013 | Huang et al. |
| 8,372,677 B2 | 2/2013 | Mehregany |
| 8,375,789 B2 | 2/2013 | Prandi |
| 8,384,134 B2 | 2/2013 | Daneman |
| 8,390,173 B2 | 3/2013 | Yoshihara et al. |
| 8,395,252 B1 | 3/2013 | Yang |
| 8,395,381 B2 | 3/2013 | Lo |
| 8,402,666 B1 | 3/2013 | Hsu |
| 8,405,170 B2 | 3/2013 | Kohl |
| 8,407,905 B1 | 3/2013 | Hsu |
| 8,413,506 B2 | 4/2013 | Coronato |
| 8,421,082 B1 | 4/2013 | Yang |
| 8,426,961 B2 | 4/2013 | Shih |
| 8,432,005 B2 | 4/2013 | Yang |
| 8,433,084 B2 | 4/2013 | Conti |
| 8,445,307 B2 | 5/2013 | Yeh et al. |
| 8,459,093 B2 | 6/2013 | Donadel |
| 8,459,110 B2 | 6/2013 | Cazzaniga |
| 8,461,935 B2 | 6/2013 | McCraith |
| 8,481,365 B2 | 7/2013 | Verheijden |
| 8,486,744 B2 | 7/2013 | Lin et al. |
| 8,487,444 B2 | 7/2013 | Law |
| 8,490,461 B2 | 7/2013 | Sasaki |
| 8,490,483 B2 * | 7/2013 | Wrede ................ G01C 19/5747 |
| | | 73/504.04 |
| 8,497,557 B2 * | 7/2013 | Tanaka ................ B81B 7/0041 |
| | | 257/415 |
| 8,508,039 B1 | 8/2013 | Nasiri |
| 8,508,045 B2 | 8/2013 | Khan |
| 8,513,747 B1 | 8/2013 | Huang et al. |
| 8,519,537 B2 | 8/2013 | Jeng |
| 8,567,246 B2 | 10/2013 | Shaeffer |
| 8,569,090 B2 | 10/2013 | Taheri |
| 8,587,077 B2 | 11/2013 | Chen |
| 8,593,036 B2 | 11/2013 | Boysel |
| 8,614,110 B1 | 12/2013 | Waters et al. |
| 8,637,943 B1 | 1/2014 | Yang |
| 8,652,961 B1 | 2/2014 | Yang |
| 8,675,181 B2 | 3/2014 | Hall |
| 8,685,776 B2 | 4/2014 | LaFond |
| 8,704,238 B2 | 4/2014 | Yang |
| 8,748,206 B2 | 6/2014 | Horning |
| 8,759,926 B2 | 6/2014 | Fujii et al. |
| 8,810,030 B2 | 8/2014 | Geisberger |
| 8,826,514 B2 | 9/2014 | Papavasiliou et al. |
| 8,869,616 B1 | 10/2014 | Sridharamurthy |
| 8,885,170 B2 | 11/2014 | Kilic |
| 8,919,199 B2 | 12/2014 | Judy et al. |
| 8,921,145 B2 | 12/2014 | Shu |
| RE45,439 E | 3/2015 | Prandi et al. |
| 9,013,233 B2 | 4/2015 | Elmallah et al. |
| 9,046,541 B1 | 6/2015 | Kubena et al. |
| 9,061,891 B2 | 6/2015 | Supino et al. |
| 9,063,549 B1 | 6/2015 | Pennecot et al. |
| 9,085,455 B2 | 7/2015 | Cheng et al. |
| 9,309,106 B2 | 4/2016 | Boysel et al. |
| 9,340,414 B2 | 5/2016 | Yoneoka et al. |
| 9,409,768 B2 | 8/2016 | DeNatale et al. |
| 9,567,204 B2 | 2/2017 | Hung et al. |
| 9,594,128 B2 | 3/2017 | Farghaly et al. |
| 9,709,595 B2 | 7/2017 | Vohra et al. |
| 9,751,754 B2 | 9/2017 | Kurashima et al. |
| 9,784,835 B1 | 10/2017 | Droz et al. |
| 9,837,935 B2 | 12/2017 | Johnson et al. |
| 9,945,950 B2 | 4/2018 | Newman et al. |
| 9,981,841 B2 | 5/2018 | Chu et al. |
| 10,365,131 B2 | 7/2019 | Grossman et al. |
| 10,392,244 B2 | 8/2019 | Hung et al. |
| 10,598,689 B2 | 3/2020 | Zwahlen et al. |
| 10,768,065 B2 * | 9/2020 | Boysel ................ B81C 1/00182 |
| 10,793,421 B2 | 10/2020 | Rajasekaran et al. |
| 11,060,866 B2 | 7/2021 | Blomqvist et al. |
| 11,287,486 B2 | 3/2022 | Boysel |
| 2001/0011994 A1 | 8/2001 | Morimoto |
| 2002/0040602 A1 | 4/2002 | Okada |
| 2003/0094046 A1 | 5/2003 | Okada |
| 2003/0209075 A1 | 11/2003 | Okada |
| 2004/0052016 A1 | 3/2004 | Takagi |
| 2004/0063239 A1 | 4/2004 | Yun et al. |
| 2004/0211258 A1 * | 10/2004 | Geen ...................... G01P 15/18 |
| | | 73/510 |
| 2004/0224279 A1 | 11/2004 | Siemons |
| 2004/0231422 A1 | 11/2004 | Okada |
| 2005/0076719 A1 | 4/2005 | Jakobsen et al. |
| 2005/0166677 A1 | 8/2005 | Nasir et al. |
| 2005/0210981 A1 | 9/2005 | Okada |
| 2005/0242991 A1 | 11/2005 | Montgomery et al. |
| 2006/0163453 A1 | 7/2006 | Hynes |
| 2006/0179941 A1 | 8/2006 | Okada |
| 2006/0180896 A1 | 8/2006 | Martin |
| 2006/0185428 A1 | 8/2006 | Combi |
| 2006/0231521 A1 | 10/2006 | Chilcott |
| 2006/0266118 A1 | 11/2006 | Denison et al. |
| 2007/0125161 A1 | 6/2007 | Bryzek et al. |
| 2007/0180912 A1 | 8/2007 | Judy et al. |
| 2007/0214886 A1 | 9/2007 | Sheynblat |
| 2007/0273018 A1 | 11/2007 | Onozuka et al. |
| 2007/0279885 A1 | 12/2007 | Basavanhally et al. |
| 2007/0297631 A1 | 12/2007 | Miles |
| 2008/0098814 A1 | 5/2008 | Platt et al. |
| 2008/0283990 A1 | 11/2008 | Nasir et al. |

(56) References Cited

U.S. PATENT DOCUMENTS

| | | |
|---|---|---|
| 2008/0289417 A1 | 11/2008 | Okada |
| 2008/0290490 A1 | 11/2008 | Fujii et al. |
| 2009/0114016 A1 | 5/2009 | Nasiri et al. |
| 2009/0199637 A1 | 8/2009 | Sugiura et al. |
| 2009/0255335 A1 | 10/2009 | Fly et al. |
| 2009/0297770 A1 | 12/2009 | Koshida et al. |
| 2010/0072626 A1 | 3/2010 | Theuss et al. |
| 2010/0084752 A1 | 4/2010 | Horning et al. |
| 2010/0132460 A1 | 6/2010 | Seeger et al. |
| 2010/0164086 A1* | 7/2010 | Noma ............... B81C 1/00238 257/686 |
| 2010/0176466 A1 | 7/2010 | Fujii et al. |
| 2010/0182418 A1 | 7/2010 | Jess et al. |
| 2010/0212425 A1 | 8/2010 | Hsu et al. |
| 2010/0218977 A1 | 9/2010 | Inoue et al. |
| 2010/0259130 A1 | 10/2010 | Eckstein et al. |
| 2010/0324366 A1 | 12/2010 | Shimotsu |
| 2011/0012248 A1 | 1/2011 | Reichenbach et al. |
| 2011/0016972 A1 | 1/2011 | Reinert |
| 2011/0030473 A1 | 2/2011 | Acar |
| 2011/0219876 A1 | 9/2011 | Kalnitsky |
| 2011/0227173 A1 | 9/2011 | Seppala et al. |
| 2011/0228906 A1 | 9/2011 | Jaffray et al. |
| 2012/0006789 A1 | 1/2012 | DeNatale et al. |
| 2012/0032286 A1 | 2/2012 | Trusov et al. |
| 2012/0042731 A1 | 2/2012 | Lin et al. |
| 2012/0048017 A1 | 3/2012 | Kempe |
| 2012/0091854 A1 | 4/2012 | Kaajakari |
| 2012/0137774 A1 | 6/2012 | Judy et al. |
| 2012/0142144 A1* | 6/2012 | Taheri .................. B81C 1/0023 438/107 |
| 2012/0227487 A1 | 9/2012 | Ayazi |
| 2012/0261822 A1 | 10/2012 | Graham et al. |
| 2012/0272734 A1 | 11/2012 | Jeung et al. |
| 2012/0280594 A1 | 11/2012 | Chen et al. |
| 2012/0291547 A1 | 11/2012 | Kim et al. |
| 2012/0300050 A1 | 11/2012 | Korichi et al. |
| 2012/0326248 A1 | 12/2012 | Daneman et al. |
| 2013/0009803 A1 | 1/2013 | Edvardsson |
| 2013/0019678 A1 | 1/2013 | Lazaroff et al. |
| 2013/0019680 A1 | 1/2013 | Kittilsland |
| 2013/0100271 A1 | 4/2013 | Howes |
| 2013/0105921 A1* | 5/2013 | Najafi .................. G01C 19/574 257/E29.324 |
| 2013/0115729 A1 | 5/2013 | Silverbrook et al. |
| 2013/0119492 A1 | 5/2013 | Feiertag et al. |
| 2013/0126992 A1 | 5/2013 | Ehrenpfordt |
| 2013/0146994 A1 | 6/2013 | Kittilsland |
| 2013/0147020 A1 | 6/2013 | Gonska et al. |
| 2013/0168740 A1 | 7/2013 | Chen |
| 2013/0181355 A1 | 7/2013 | Tsai |
| 2013/0192363 A1 | 8/2013 | Loreck et al. |
| 2013/0192369 A1 | 8/2013 | Acar et al. |
| 2013/0210175 A1 | 8/2013 | Hoisington et al. |
| 2013/0221454 A1 | 8/2013 | Dunbar, III et al. |
| 2013/0241546 A1 | 9/2013 | Fu |
| 2013/0253335 A1 | 9/2013 | Noto et al. |
| 2013/0270657 A1 | 10/2013 | Acar |
| 2013/0277773 A1* | 10/2013 | Bryzek .................... H01G 7/06 257/415 |
| 2013/0285165 A1 | 10/2013 | Classen et al. |
| 2013/0299924 A1 | 11/2013 | Weber et al. |
| 2013/0315036 A1 | 11/2013 | Paulson et al. |
| 2013/0341737 A1 | 12/2013 | Bryzek et al. |
| 2014/0007685 A1 | 1/2014 | Zhang et al. |
| 2014/0090469 A1 | 4/2014 | Comi et al. |
| 2014/0090485 A1 | 4/2014 | Feyh et al. |
| 2014/0091405 A1 | 4/2014 | Weber |
| 2014/0092460 A1 | 4/2014 | Schwedt et al. |
| 2014/0116135 A1 | 5/2014 | Cazzaniga |
| 2014/0116136 A1 | 5/2014 | Coronato |
| 2014/0124958 A1 | 5/2014 | Bowles |
| 2014/0125325 A1 | 5/2014 | Dcak et al. |
| 2014/0125359 A1 | 5/2014 | El-Gamal et al. |
| 2014/0137648 A1 | 5/2014 | Zolfagharkhani |
| 2014/0138853 A1 | 5/2014 | Liu |
| 2014/0162393 A1 | 6/2014 | Yang |
| 2014/0166463 A1 | 6/2014 | Jahnes |
| 2014/0183729 A1 | 7/2014 | Bowles |
| 2014/0186986 A1 | 7/2014 | Shu |
| 2014/0193949 A1 | 7/2014 | Wu |
| 2014/0203421 A1 | 7/2014 | Shu |
| 2014/0210019 A1 | 7/2014 | Nasiri |
| 2014/0227816 A1 | 8/2014 | Zhang |
| 2014/0230548 A1 | 8/2014 | Coronato |
| 2014/0231936 A1 | 8/2014 | Jahnes |
| 2014/0231938 A1 | 8/2014 | Campedelli |
| 2014/0260612 A1 | 9/2014 | Aono et al. |
| 2014/0260617 A1* | 9/2014 | Ocak ..................... G01P 15/125 73/514.39 |
| 2014/0264648 A1 | 9/2014 | Chu et al. |
| 2014/0264650 A1 | 9/2014 | Liu et al. |
| 2014/0283605 A1 | 9/2014 | Baldasarre |
| 2014/0287548 A1 | 9/2014 | Lin |
| 2014/0291128 A1 | 10/2014 | Kwa |
| 2014/0311242 A1 | 10/2014 | Lee |
| 2014/0311247 A1 | 10/2014 | Zhang |
| 2014/0318906 A1 | 10/2014 | Deimerly |
| 2014/0319630 A1 | 10/2014 | Conti |
| 2014/0322854 A1 | 10/2014 | Nakatani |
| 2014/0326070 A1 | 11/2014 | Neul |
| 2014/0331769 A1 | 11/2014 | Fell |
| 2014/0339654 A1 | 11/2014 | Classen |
| 2014/0339656 A1 | 11/2014 | Schlarmann |
| 2014/0349434 A1 | 11/2014 | Huang |
| 2014/0352433 A1 | 12/2014 | Hammer |
| 2014/0353775 A1 | 12/2014 | Formosa |
| 2014/0357007 A1 | 12/2014 | Cheng |
| 2014/0370638 A1 | 12/2014 | Lee |
| 2014/0374850 A1 | 12/2014 | Chen et al. |
| 2014/0374854 A1 | 12/2014 | Xue |
| 2014/0374917 A1 | 12/2014 | Weber |
| 2014/0374918 A1 | 12/2014 | Weber |
| 2015/0008545 A1 | 1/2015 | Quevy |
| 2015/0115376 A1 | 4/2015 | Chen et al. |
| 2015/0191345 A1 | 7/2015 | Boysel et al. |
| 2015/0198493 A1 | 7/2015 | Kaelberer et al. |
| 2015/0329351 A1 | 11/2015 | Cheng et al. |
| 2015/0330782 A1 | 11/2015 | Johnson et al. |
| 2015/0371390 A1 | 12/2015 | Gassner et al. |
| 2016/0003923 A1 | 1/2016 | Zieren et al. |
| 2016/0060104 A1 | 3/2016 | Chu et al. |
| 2016/0229684 A1 | 8/2016 | Boysel |
| 2016/0229685 A1 | 8/2016 | Boysel |
| 2016/0289063 A1 | 10/2016 | Ocak et al. |
| 2016/0320426 A1 | 11/2016 | Boysel et al. |
| 2017/0030788 A1 | 2/2017 | Boysel et al. |
| 2017/0108336 A1 | 4/2017 | Boysel et al. |
| 2018/0327255 A1 | 11/2018 | Endean et al. |
| 2020/0346920 A1 | 11/2020 | Endean et al. |
| 2021/0156756 A1 | 5/2021 | Boysel et al. |
| 2021/0198096 A1 | 7/2021 | Borca-Tasciuc et al. |

FOREIGN PATENT DOCUMENTS

| | | |
|---|---|---|
| EP | 1819012 A2 | 8/2007 |
| EP | 2410344 A2 | 1/2012 |
| EP | 2544302 A1 | 1/2013 |
| EP | 2693182 A1 | 2/2014 |
| EP | 2693183 A1 | 2/2014 |
| EP | 3019442 A1 | 5/2016 |
| JP | 2008-114354 A | 5/2008 |
| JP | 2008-132587 A | 6/2008 |
| JP | 2009-245877 A | 10/2009 |
| JP | 2011-194478 A | 10/2011 |
| JP | 2012-247192 A | 12/2012 |
| JP | 2013-030759 A | 2/2013 |
| JP | 2013-164285 A | 8/2013 |
| WO | 2008086530 A2 | 7/2008 |
| WO | 2009/009803 A2 | 1/2009 |
| WO | 2009057990 A2 | 5/2009 |
| WO | 2011/151098 A2 | 12/2011 |
| WO | 2012/037539 A2 | 3/2012 |
| WO | 2013116356 A1 | 8/2013 |

(56) References Cited

FOREIGN PATENT DOCUMENTS

| | | |
|---|---|---|
| WO | 2014122910 A1 | 8/2014 |
| WO | 2014159957 A1 | 10/2014 |
| WO | 2014177542 A1 | 11/2014 |
| WO | 2014184025 A1 | 11/2014 |
| WO | 2015003264 A1 | 1/2015 |
| WO | 2015013827 A1 | 2/2015 |
| WO | 2015013828 A1 | 2/2015 |
| WO | 2015/038078 A1 | 3/2015 |
| WO | 2015042700 A1 | 4/2015 |
| WO | 2015042701 A1 | 4/2015 |
| WO | 2015042702 A1 | 4/2015 |
| WO | 2015103688 A1 | 7/2015 |
| WO | 2015154173 A1 | 10/2015 |

OTHER PUBLICATIONS

Virtus Sensor Technology by Dr. Mark Boysel, Semicon Japan, Nov. 11, 2008.

Development of a Single-Mass Five-Axis MEMS Motion Sensor, by R.M. Boysel, L.J. Ross, Virtus Advanced Sensors, Inc.., May 2009.

SOI micromachined 5-axis motion sensor using resonant electrostatic drive and non-resonant capacitive detection mode by Yoshiyuki Watanabe, Toshiaki Mitsui, Takashi Mineta, Yoshiyuki Matsu, Kazuhiro Okada, Available online Jan. 18, 2006.

U.S. Appl. No. 16/694,607, filed Nov. 25, 2019, Pending.

U.S. Appl. No. 15/024,722, filed Mar. 24, 2016, U.S. Pat. No. 10,273,147, Issued.

U.S. Appl. No. 16/283,002, filed Feb. 22, 2019, Pending.

U.S. Appl. No. 15/315,894, filed Dec. 2, 2016, 2017-0108336, Published.

U.S. Appl. No. 16/046,764, filed Jul. 26, 2018, 2019-0064364, Published.

U.S. Appl. No. 15/024,711, filed Mar. 24, 2016, U.S. Pat. No. 10,273,147, Issued.

U.S. Appl. No. 15/024,704, filed Mar. 24, 2016, 2016-0229684, Abandoned.

U.S. Appl. No. 15/206,935, filed Jul. 11, 2016, U.S. Pat. No. 10,214,414, Issued.

U.S. Appl. No. 16/283,002, filed Feb. 22, 2019, Abandoned.

U.S. Appl. No. 17/185,877, filed Feb. 25, 2021, Pending.

U.S. Appl. No. 15/302,731, filed Oct. 7, 2016, 2017-0030788, Abandoned.

U.S. Appl. No. 16/694,607, filed Nov. 25, 2019, U.S. Pat. No. 10,768,065, Issued.

U.S. Appl. No. 17/012,896, filed Sep. 4, 2020, 2021-0156756, Published.

U.S. Appl. No. 15/315,894, filed Dec. 2, 2016, 2017-0108336, Abandoned.

U.S. Appl. No. 16/046,764, filed Jul. 26, 2018, 2019-0064364, Abandoned.

U.S. Appl. No. 15/534,702, filed Jun. 9, 2017, 2017-0363694, Published.

U.S. Appl. No. 15/543,700, filed Jul. 14, 2017, U.S. Pat. No. 10,407,299, Issued.

U.S. Appl. No. 17/470,912, filed Sep. 9, 2021, Pending.

U.S. Appl. No. 15/558,807, filed Jul. 14, 2017, 2018-0074090, Abandoned.

U.S. Appl. No. 14/622,619, filed Feb. 13, 2015, U.S. Pat. No. 9,309,106, Issued.

European Search Report for Application No. 14822259.9 dated Jan. 4, 2017.

International Search Report and Written Opinion for International Patent Application No. PCT/CA2014/050729, dated Nov. 3, 2014.

International Search Report and Written Opinion for International Patent Application No. PCT/CA2014/050902, dated Dec. 15, 2014.

International Search Report and Written Opinion for International Patent Application No. PCT/CA2014/050904, dated Dec. 1, 2014.

International Search Report and Written Opinion for International Patent Application No. PCT/CA2014/050910, dated Dec. 22, 2014.

International Search Report and Written Opinion for International Patent Application No. PCT/CA2014/051245, dated Feb. 25, 2015.

International Search Report and Written Opinion for International Patent Application No. PCT/CA2015/050018, dated Apr. 20, 2015.

International Search Report and Written Opinion for International Patent Application No. PCT/CA2015/050026, dated Apr. 27, 2015.

Chan et al., A Monolithically Integrated Pressure/Oxygen/Temperature Sensing SoC for Multimodality Intracranial Neuromonitoring. IEEE Journal of Solid-State Circuits. Nov. 2014;49(11):2449-61.

Merdassi et al., Capacitive MEMS absolute pressure sensor using a modified commercial microfabrication process. Microsystem Technol. Aug. 2017;23(8):3215-25. Published Online Jun. 20, 2016.

Merdassi et al., Design and Fabrication of 3-Axis Accelerometer Sensor Microsystem for Wide Temperature Range Applications Using Semi-Custom Process. Proc of SPIE. Mar. 2014;8973:89730O-1-89730O-12.

Merdassi et al., Design of 3-axis Capacitive Low-Gravity MEMS Accelerometer with Zero Cross-Axis Sensitivity in a Commercial Process. NSTI-Nanotech, www.nsti.org. Jan. 2013;2:185-188.

Merdassi et al., Wafer level vacuum encapsulated tri-axial accelerometer with low cross-axis sensitivity in a commercial MEMS Process. Sensors and Actuators A. Oct. 2015;236:25-37.

Merdassi, Ulta-Clean Wafer-Level Vacuum Encapsulated Intertial Using Commerical Process. Department of Electrical and Computer Engineering McGill University, Montreal, Canada. A thesis submitted to McGill University in partial fulfillment of the Requirements of the degree of Docto of Philosopy. 158 pages, Jul. 2016.

* cited by examiner

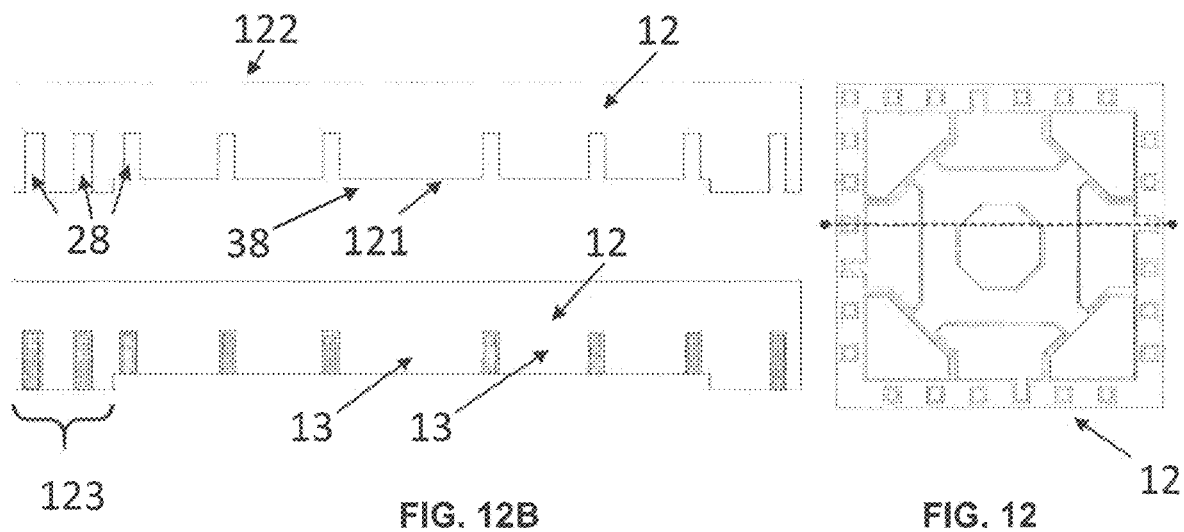
FIG. 12A
FIG. 12B
FIG. 12
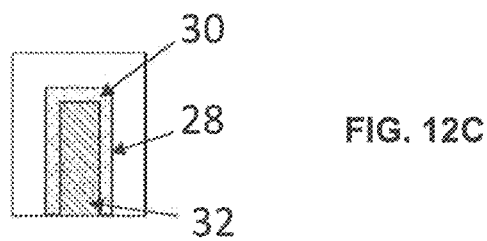
FIG. 12C
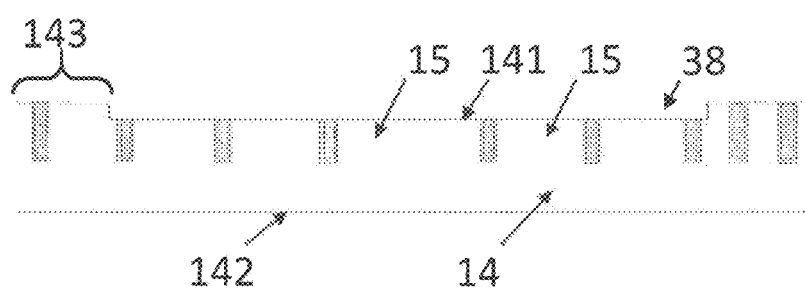
FIG. 13A
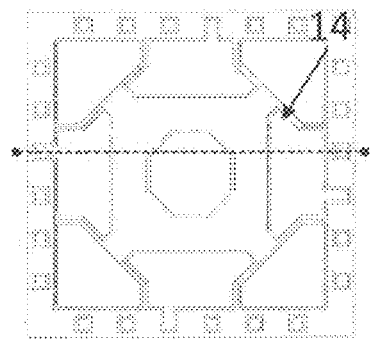
FIG. 13

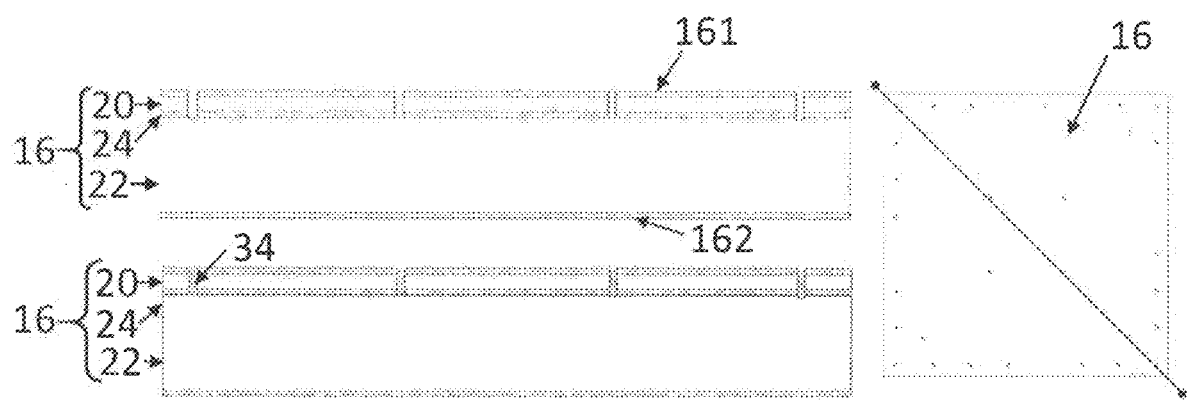
FIG. 14A
FIG. 14B    FIG. 14
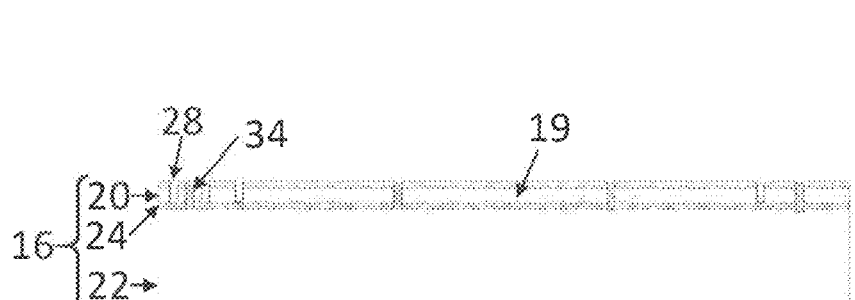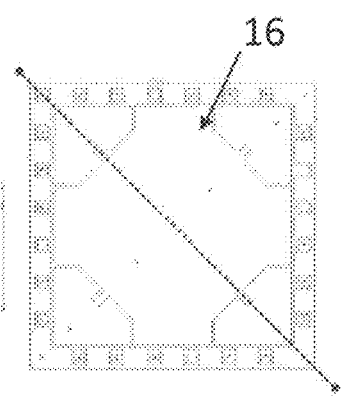
FIG. 15A    FIG. 15

MEMS MOTION SENSOR AND METHOD OF MANUFACTURING

RELATED APPLICATIONS

This patent application is a continuation-in-part of international application no. PCT/CA2014/050730 filed on Aug. 1, 2014, which claims priority from U.S. application No. 61/861,786 filed on Aug. 2, 2013 and from U.S. application No. 61/861,821 filed on Aug. 2, 2013. The disclosures of each of these applications are incorporated herein by reference in their entirety.

TECHNICAL FIELD OF THE INVENTION

This invention relates to MicroElectroMechanical Systems (MEMS) motion sensors enabling electrical measurements from top and/or bottom caps. The invention also relates to a method for manufacturing MEMS motion sensors.

BACKGROUND

MEMS inertial sensors, which include accelerometers and angular rate sensors or gyroscopes, are used in a growing number of applications which have been increasing steadily over the past decade.

Presently, most MEMS gyroscopes use polysilicon as their mechanical material. However, due to the build-up of stresses in films deposited during the fabrication of these devices, processes for physical and chemical deposition are limited to only a few micrometers of material. Consequently polysilicon devices tend to have small masses. Small sensing masses provide low measurement sensitivity and higher vulnerability to thermal noise. Additionally, since springs and comb electrodes are patterned in the same material as the mass, the spring and electrode widths are limited to only a few microns, leading to small sense capacitances and weak springs. Furthermore, the dimensions of the capacitors, springs, and proof mass are all determined by the mechanical polysilicon film thickness. Some MEMS gyroscope manufacturers have tried to address sensitivity and noise issues by using a thicker MEMS layer made out of a single crystal silicon layer. However, as with the polysilicon devices, the spring width cannot be decoupled from the mass thickness. If the mass thickness is increased to increase sensitivity or decrease noise, the spring stiffness will increase, counteracting the effects of the mass increase.

MEMS gyroscopes are generally two-dimensional architectures using comb drives and detectors. The directions parallel to the plane of the device (typically denoted x and y) are similar (in mass distribution, symmetry, etc.), but the direction perpendicular to the plane (z) is different from the other two. Consequently, different angular rate transduction methods must be used for each, resulting in two classes of gyroscopes: 2 axis x/y gyroscopes and 1 axis z gyroscopes. Devices marketed as three axis gyroscopes typically consist of three gyroscopes integrated onto the same chip with as many as four to six proof masses.

Numerous subsequent improvements in MEMS inertial measurement unit (IMU) packaging have been made to simplify the package and reduce cost. Most of these approaches take advantage of the 2D planar nature of silicon microelectronics fabrication. Most MEMS devices are fabricated by successively depositing thin films, using a photolithographic process to form the desired 2D shape of the film, such as the MEMS inertial sensor proof mass, and etching the pattern into the film. In some cases the photolithographic process produces a form into which the film is plated or deposited to form the desired pattern. This process sequence is repeated over and over to form the final device. As a result, most MEMS devices are planar or two-dimensional since they consist of a stack of very thin films, each typically on the order of micrometer thick or less.

In all these cases a cap (e.g. silicon or glass) is placed over the MEMS to protect it and electrical contact is made to the top of the MEMS and/or CMOS. Most of these integration approaches are based on the 2D nature of the sensors with detection and signal transduction in the plane of the device. For example, almost all accelerometers and gyroscopes use comb capacitors for drive and detection in the plane of the device. Consequently the electrical leads have to be brought out on the MEMS wafer under the cap, so IMU packaging still requires wire bonding and packaging.

Efforts have been made to overcome the sensitivity limitations due to the small mass by using bulk silicon micromachining to fabricate a larger proof mass from the full thickness of the silicon wafer. Most of these efforts have been directed towards the development of accelerometers; little work has been done on large proof mass gyroscopes.

What is needed is a MEMS motion sensor which allows transmitting electrical signals from within the sensor to at least one cap, while enclosing the proof mass. It would also be desirable for the motion sensor to allow measurement of acceleration along three axes, and also the measurement of angular rate. Current pendulous accelerometer designs have not been successfully adapted to angular velocity measurements.

Additionally, what is needed is a wafer-scale fabrication method in which the proof mass is sealed in an enclosure which provides electrodes above and also below the proof mass, to drive and sense the motion.

SUMMARY OF THE INVENTION

A MEMS motion sensor is provided. The MEMS wafer has first and second opposed sides and includes an outer frame, a proof mass and flexible springs suspending the proof mass relative to the outer frame and enabling the proof mass to move relative to the outer frame along mutually orthogonal x, y and z axes. The sensor also includes top and bottom cap wafers respectively bonded to the first and second sides of the MEMS wafer. The top cap wafer, the bottom cap wafer and the outer frame of the MEMS wafer define a cavity for housing the proof mass. The MEMS wafer, the top cap wafer and the bottom cap wafer are electrically conductive, and are preferably made of silicon-based semiconductor. Top and bottom cap electrodes are respectively provided in the top and bottom cap wafers and form capacitors with the proof mass, the top and bottom cap electrodes are configurable to detect a motion of the proof mass. Electrical contacts are provided on the top cap wafer and form first and second sets of electrical contacts. The electrical contact of the first set are connected to the respective top cap electrodes, and the electrical contacts of the second set are connected to the respective bottom cap electrodes by way of respective insulated conducting pathways, each extending along the z axis from one of the respective bottom cap electrodes and upward successively through the bottom cap wafer, the outer frame of the MEMS wafer and the top cap wafer.

In some embodiments, the proof mass and flexible springs form a resonant structure having resonant frequencies $f_x$, $f_y$ and $f_z$ for motion along the x, y and z axes, respectively.

In some embodiments, the MEMS motion sensor comprises electrode assemblies (or sets of electrodes), each including at least one pair of the top and/or bottom cap electrodes. Preferably, the motion sensor includes a first set of electrodes configurable to detect a rocking motion of the proof mass about the y axis, indicative of an acceleration of the proof mass along the x axis; a second set of electrodes configurable to detect a rocking motion of the proof mass about the x axis, indicative of an acceleration of the proof mass along the y axis; and a third set of electrodes configured to detect a translational motion of the proof mass along the z axis, indicative of an acceleration of the proof mass along the z axis.

In some embodiments, one set of electrode is configured to vibrate the proof mass at a drive frequency along the z axis, and two other sets of electrodes are configured to detect Coriolis-induced oscillations of the proof mass along the x and y axes, indicative of an angular motion of the proof mass about the y and x axes, respectively.

The drive frequency preferably corresponds to the resonant frequency $f_z$. In some embodiments, the resonant frequency $f_z$ is substantially identical to each of the respective resonant frequencies $f_x$, $f_y$, in order to provide matched resonance conditions. Preferably, a relative difference between any two of the resonant frequencies $f_z$, $f_x$, $f_y$ is no more than 10%. It is also possible that the resonant structure be shaped, sized and configured with each of the resonant frequencies $f_x$, $f_y$ and $f_z$ being substantially different, for example with mutually non-overlapping 3 dB-bandwidths, in order to provide non-matched resonance conditions.

In some embodiments, the drive frequency is lower than at least one of the respective resonant frequencies $f_x$ and $f_y$, such as 10-40% lower.

In some embodiments, one set of electrodes is configured to vibrate the proof mass at a drive frequency along a corresponding one of the x and y axes, respectively, and another set of electrodes is configured to detect Coriolis-induced oscillations of the proof mass along the other one of the x and y axes, indicative of an angular motion of the proof mass about the z axis.

In some embodiments, the resonant structure is shaped, sized and configured such that each of the resonant frequencies $f_x$, $f_y$ and $f_z$ is substantially higher than sensing frequencies at which the electrode assemblies are configured to detect the motion of the proof mass in response to accelerations of the proof mass along to the x, y and z axes, respectively.

In some embodiments, the top and bottom cap electrodes may comprise a pair of said top and bottom electrodes aligned with the z axis, which is centered relative to the proof mass. The top and bottom cap electrodes may also comprise two pairs of said top and bottom electrodes disposed along the x axis on each side of the y axis, and also possibly two pairs of said top and bottom electrodes disposed along the y axis on each side of the x axis.

In some embodiments, the proof mass can be shaped as a convex polygonal prism, which is preferably regular, such as an octagonal prism. Typically, the motion sensor includes four flexible springs.

The top and bottom electrodes typically extend through the entire thicknesses of the top and bottom cap wafers, respectively, and are preferably delimited by insulated channels. Preferably, the MEMS wafer is a silicon on insulator (SOI) wafer with an insulating layer separating a device layer from a handle layer, and the proof mass can be patterned in both the device and handle layers.

In some embodiments, the motion sensor comprise an additional insulated conducting pathway extending through the bottom cap wafer, through the frame of the MEMS wafer, and though the top cap wafer, between one of the electrical contacts of the top cap wafer to the electrical contact of the bottom cap wafer, thereby forming a conductive feedthrough.

A method for manufacturing the MEMS motion sensor is also provided. The method comprises the steps of:

a) providing the top and bottom cap wafers and forming insulated conducting cap wafer channels; patterning trenches and filling the trenches to form electrodes on the inner sides of the cap wafers, some of the insulated conducting cap wafer channels being electrically connected to the respective electrodes;

b) providing a MEMS wafer and patterning portions of the proof mass, of the flexible springs and of the outer frame with insulated conducting MEMS wafer channels in one of the first and second sides;

c) bonding the side of the MEMS wafer patterned in step b) to the inner side of the top or bottom cap wafer by aligning the insulated conducting cap wafer channels with the corresponding portions of the insulated conducting MEMS channels, and by aligning the electrodes relative to the proof mass and the springs;

d) patterning the remaining portions of the proof mass, of the flexible springs and of the outer frame (164) with the insulated conducting MEMS wafer channels on the other side of the MEMS wafer;

e) bonding the side of the MEMS wafer patterned in step d) to the inner side of the other top or bottom cap wafer, by aligning the electrodes of the top cap wafer with the electrodes of the bottom cap wafer and by aligning the insulated conducting cap wafer channels of the other cap wafer with the remaining portions of the insulated conducting MEMS channels, creating insulated conducting pathways, some of which extend from the electrodes of the bottom cap wafer, through the outer frame of the MEMS wafer and through the top cap wafer, and enclosing the proof mass suspended relative to the outer frame by the flexible springs within a cavity formed by the top and bottom cap wafers and by the outer frame (164) of the MEMS wafer (16); and f) removing a portion of the top and bottom cap wafers to expose and isolate the insulated conducting pathways and the electrodes in the top and bottom cap wafers.

The method can also include a step of forming electrical contacts on the outer side of the top cap wafer connected with the insulated conducting pathways, allowing routing of electrical signals from the electrodes of the bottom cap wafer to these electrical contacts. The method can also include a step of forming electrical contacts on the bottom cap wafer, connected to some of the insulated conducting pathways, allowing routing of electrical signals to the electrical contacts on the bottom cap wafer.

Of course, other processing steps may be performed prior, during or after the above described steps. The order of the steps may also differ, and some of the steps may be combined.

DESCRIPTION OF THE DRAWINGS

It should be noted that the appended drawings illustrate only exemplary embodiments of the invention and should therefore not be considered limiting of its scope, as the invention may admit to other equally effective embodiments.

FIGS. 12, 12A, 12B and 12C are views of the MEMS sensor structure including FIG. 12, which is a bottom view of a first or top cap wafer of the MEMS motion sensor of FIG. 1. FIGS. 12A and 12B are cross-sectional views of FIG. 11. FIG. 11A shows the etching of trenches in the top cap wafer. FIG. 11B shows the filling of the trenches of the top cap wafer with insulating and conducting material, for forming top cap wafer electrodes and channels. FIG. 11C is an enlarged view of a filled trench, according to a possible embodiment.

FIGS. 13 and 13A are top and cross-sectional views, respectively, in which FIG. 13 is a top view of a second or bottom cap wafer of the MEMS motion sensor of FIG. 1. FIG. 13A is a cross-sectional view of FIG. 13, showing trenches of the bottom wafer cap filled with insulating and conducting material, for forming bottom cap wafer electrodes and channels.

FIG. 14 is a top view of the MEMS wafer of the MEMS motion sensor of FIG. 1, during one of the manufacturing steps. In this embodiment, the MEMS wafer is a SOI wafer.

FIGS. 14A and 14B are cross-sectional views of the MEMS wafer of FIG. 14, showing the fabrication of SOI conducting shunts.

FIG. 15 is a top view of the MEMS wafer during another manufacturing step.

FIG. 15A is a cross-sectional view of the MEMS wafer of FIG. 15, showing the patterning of part of the proof mass and of the feedthrough channels in the frame portion of the device layer.

FIGS. 18 and 18A are perspective and cross-sectional views of the bottom cap wafer (located on top), respectively, wherein FIG. 18A is a cross-sectional view of the bottom cap wafer bonded to the MEMS wafer, showing the alignment of the bottom cap wafer with the second side of the MEMS wafer, which in this embodiment corresponds to the device layer side.

FIGS. 24 and 24A are top and side views in which FIG. 24 is a top side perspective view of the MEMS device of FIG. 1. FIG. 24A is a cross-sectional view of the MEMS motion sensor of FIG. 24, showing the openings in the insulating film over the pond pads.

DETAILED DESCRIPTION OF AN EMBODIMENT OF THE INVENTION

Figure 1:
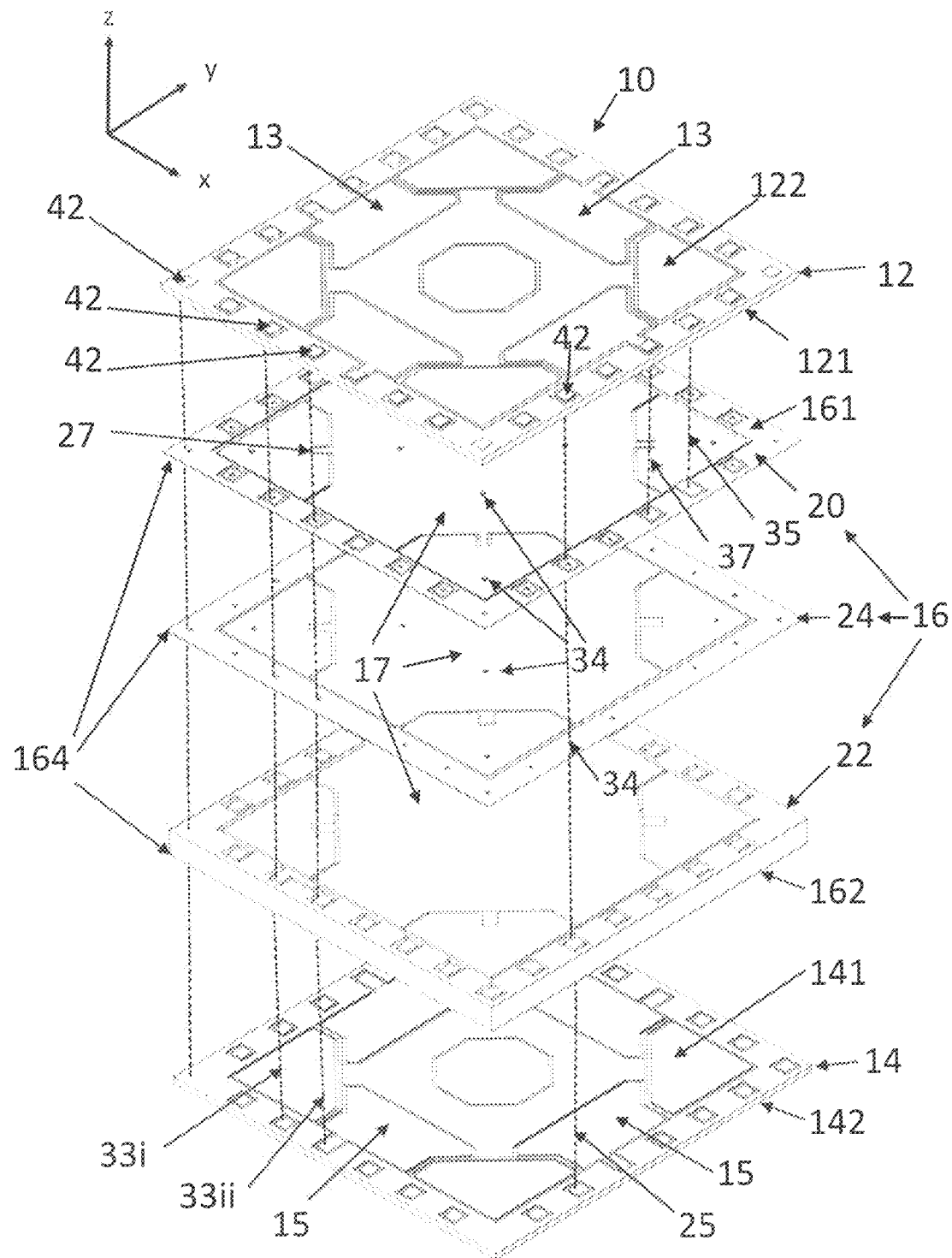
FIG. 1 is an exploded view of a MEMS motion sensor, according to a possible embodiment.

In the following description, similar features of the drawings have been given similar reference numerals. To preserve the clarity of the drawings, some reference numerals have been omitted when they were already identified in a preceding figure.

The present invention provides a MEMS motion sensor formed by a top cap wafer, a central MEMS wafer and a bottom cap wafer, the wafers being made of an electrically conducting material, such as silicon. Both the top and bottom cap wafers are provided with electrodes on both sides of a pendulous proof mass. The MEMS motion sensor also includes insulated conducting pathways, at least some of which extend from electrodes in the bottom cap wafer, through the MEMS wafer and to the top cap wafer, allowing routing or transmitting electrical signals sensed by the electrodes of the bottom cap through the MEMS wafer, and more specifically through the lateral frame of the sensor, from the bottom cap wafer to the top cap wafer. This architecture of the MEMS motion sensor enables the placement of electrodes and electrical leads above, below, and/or around a pendulous proof mass, for measuring acceleration and/or angular velocity. This architecture of the MEMS motion sensor thus not only allows encapsulating the proof mass, it also makes efficient use of the protective caps by including electrodes in the caps, and by providing insulated conducted pathways which allow routing signals from the bottom side of the sensor to the top side, allowing the placement of the electrical contacts on a single side of the sensor. Of course, if needed, electrical contacts can also be placed on the bottom side of the sensor. Yet another advantage of the present MEMS motion sensor resides in the patterning of a bulk, pendulous proof mass (having for example a thickness varying from 400 to 700 um), which is suspended by flexible springs patterned such that they are much thinner than the proof mass. Further details regarding devices and methods of operating motion sensors are described in international application number PCT/CA2014/ 050635 entitled "MEMS Device and Method of Manufacturing" filed on Jul. 4, 2014, and the corresponding U.S. Application No. filed on Feb. 13, 2015, the entire contents of these applications being incorporated herein by reference.

Figure 2:
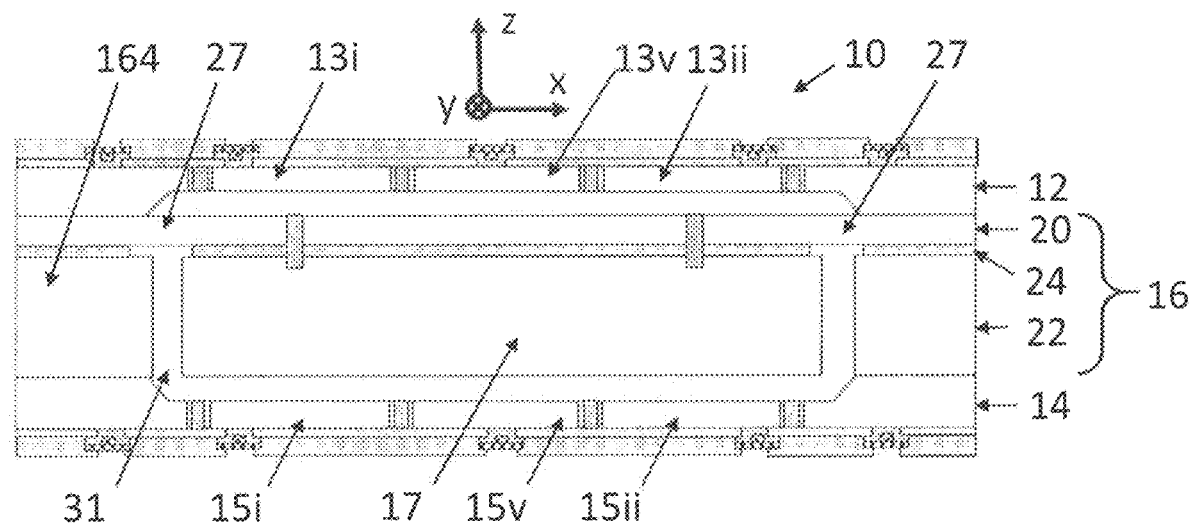
FIG. 2 is a schematic cross-sectional view of a MEMS motion sensor of showing the position of the proof mass in the absence of acceleration or angular velocity.

Referring to FIGS. 1 and 2, an exploded view and cross-sectional view respectively of the different layers of a MEMS motion sensor 10 according to a possible embodiment are shown. The MEMS device 10 includes a central MEMS wafer 16 having first and second opposed sides 161,162. The MEMS wafer 16 includes an outer frame 164, a proof mass 17 and flexible springs 27 suspending the proof mass 17 relative to the outer frame 164 and enabling the proof mass 17 to move in 3 dimension relative to the outer frame 164 along mutually orthogonal x, y and z axes. The motion sensor 10 also includes top and bottom cap wafers 12, 14 respectively bonded to the first and second sides 161, 162 of the MEMS wafer 16. The top cap wafer 12, the bottom cap wafer 14 and the outer frame 164 of the MEMS wafer 16 defining a cavity 31 for housing the proof mass 17. The MEMS wafer 16, the top cap wafer 12 and the bottom cap wafer 14 are made of electrically conductive material.

The motion sensor 10 includes top and bottom cap electrodes 13, 15 respectively provided in the top and bottom cap wafers 12, 14, and forming capacitors with the proof mass 17. The electrodes are configured to detect a motion of the proof mass 17, such as a translation along the z axis, or a rocking along the x or y axis. Electrical contacts 42 are provided on the top cap wafer 12. The contacts 42 form first and second sets of electrical contacts: the electrical contact of the first set are connected to the top cap electrodes 13, and the electrical contacts of the second set are connected to the bottom cap electrodes 15 by way of respective insulated conducting pathways, such as pathway 33ii. The pathways connected to the bottom cap electrodes extend upward along the z axis, successively through the bottom cap wafer 14, the outer frame 164 of the MEMS wafer 16 and the top cap wafer 12. Of course, other electrical contacts can be provided on the top cap wafer, such as for connecting feedthroughs extending from the bottom to the top cap for example, and other insulated conducting pathways, such as pathway 33i, can be provided for connecting electrodes of the top cap wafer, and also possibly of the proof mass.

In the present description, the terms "top" and "bottom" relate to the position of the wafers as shown in the figures. Unless otherwise indicated, positional descriptions such as "top", "bottom" and the like should be taken in the context of the figures and should not be considered as being limitative. The top cap wafer can also be referred as a first cap wafer, and the bottom cap wafer can be referred as a second cap wafer. The terms "top" and "bottom" are used to facilitate reading of the description, and persons skilled in the art of MEMS know that, when in use, MEMS devices can be placed in different orientations such that the "top cap wafer" and the "bottom cap wafer" are positioned upside down. In this particular embodiment, the "top" refers to the direction of the device layer.

Figure 5:
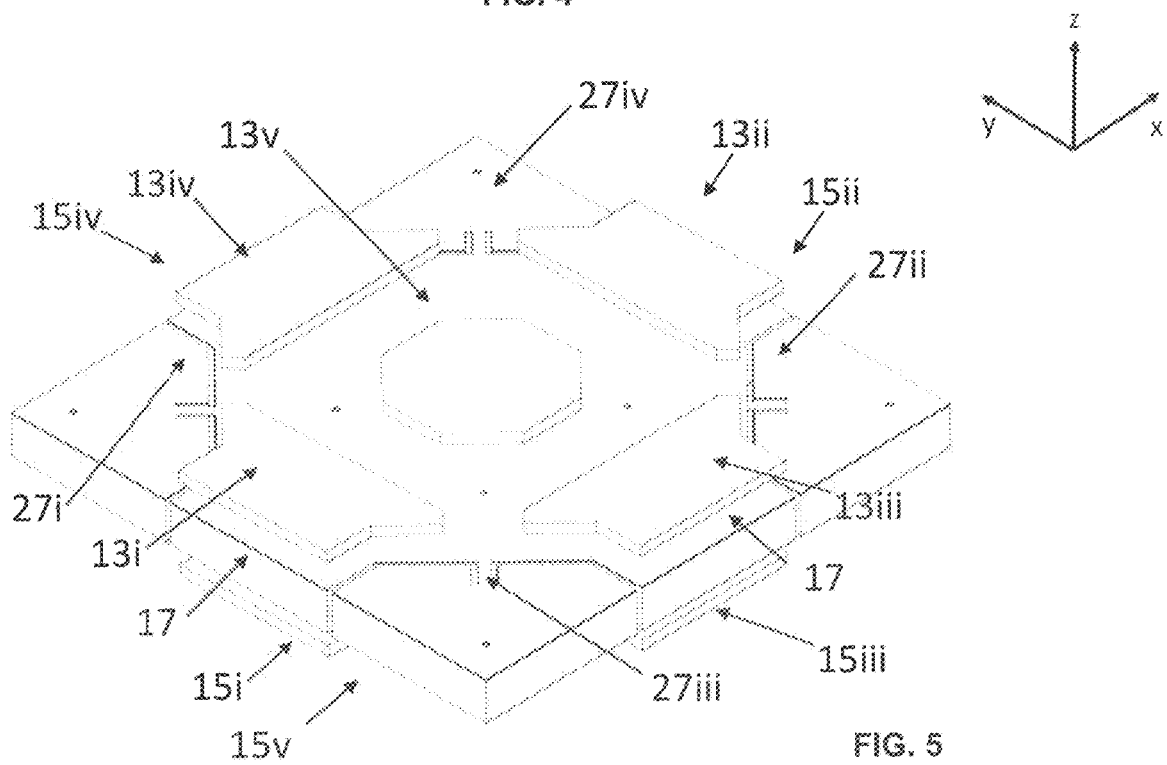
FIG. 5 is a partial perspective view of a motion sensor showing the electrodes and proof mass, for measuring acceleration along the x, y and z axis.

In this specific embodiment, the proof mass 17 is suspended by four flexible springs (27i, 27ii, 27iii and 27iv— identified in FIG. 5) between the two caps 12, 14, each with five electrodes (13i, 13ii, 13ii, 13iv, 13v and 15i, 15ii, 15iii, 15iv and 15v—also identified in FIG. 5) disposed to measure the position of the proof mass in 3-dimensional space in response to acceleration and angular velocity. The capacitance is monitored between pairs of electrodes, for example 13i and 15i or 13i, 13ii and the proof mass. Of course, the number of electrodes can vary depending on the application in which the motion sensor is to be used, and a pair of electrodes does not necessarily need to be aligned and does not necessarily include a top and a bottom electrode. The motion sensor includes reconfigurable electrode assemblies or "sets" of electrodes to monitor the position of the proof mass within the cavity. An electrode assembly can include paired top cap electrodes, paired bottom cap electrodes or paired top and bottom cap electrodes. An electrode assembly can include one or more paired electrodes. The electrode assemblies can be reconfigured depending of the measurement to be made.

The proof mass 17 and flexible springs 27 form together a resonant structure having resonant frequencies $f_x$, $f_y$ and $f_z$ for motion along the x, y and z axes, respectively. The resonant frequencies can be set by adjusting the width and thickness of the springs and/or the size and shape of the proof mass.

Referring to FIGS. 2 to 5, schematic cross-sections of a motion sensor 10 taken along the x axis illustrate the motion of the proof mass 17 in different situations. In the absence of acceleration and angular velocity, as shown in FIG. 2, the proof mass 17 is ideally positioned equidistant between top electrodes 13i, 13ii, 13v and bottom electrodes 15i, 15ii, 15v such that the differential capacitance is zero, i.e.: $[C_{x\text{-}Top}]-[C_{x\text{-}Bottom}]=0$.

Figure 3:
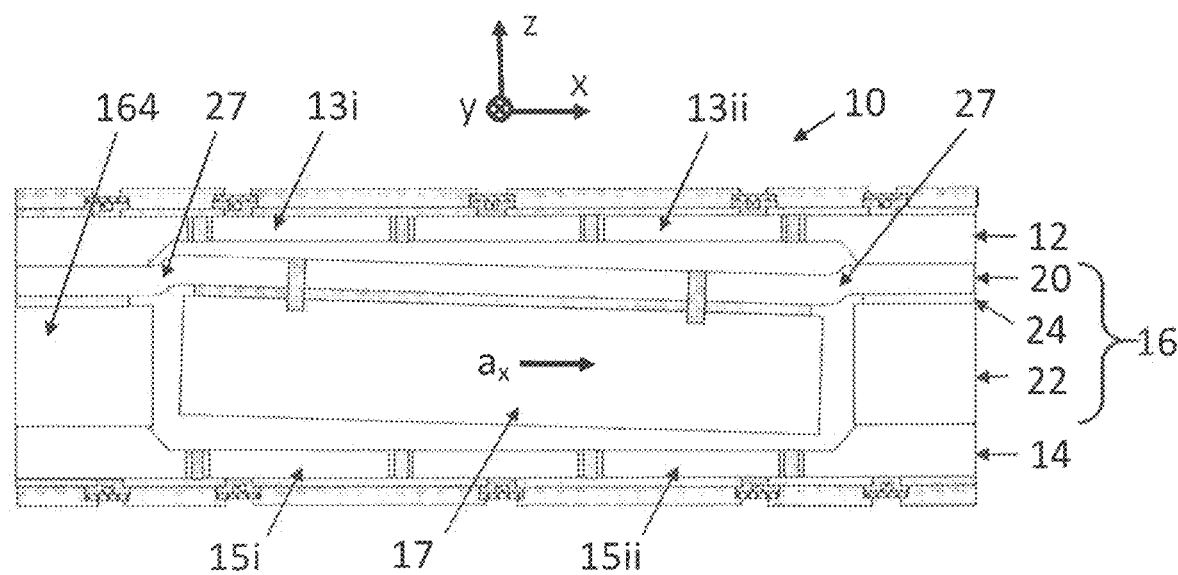
FIG. 3 is a cross-sectional view of the MEMS motion sensor of FIG. 2, showing the rotation of the proof mass in response to acceleration in the x direction.

In FIG. 3, the sensor 10 is subjected to acceleration along the x axis, causing the proof mass to rotate around the center of the resonant structure with an axis of rotation in the y direction; this rotation leads to a change in differential capacitance proportional to the acceleration. For example, measuring the difference in capacitance between 13i and 13 ii yields a differential capacitance proportional to the x acceleration. Similarly, acceleration along the y axis causes the proof mass to rotate around the x in the same manner.

Figure 4:
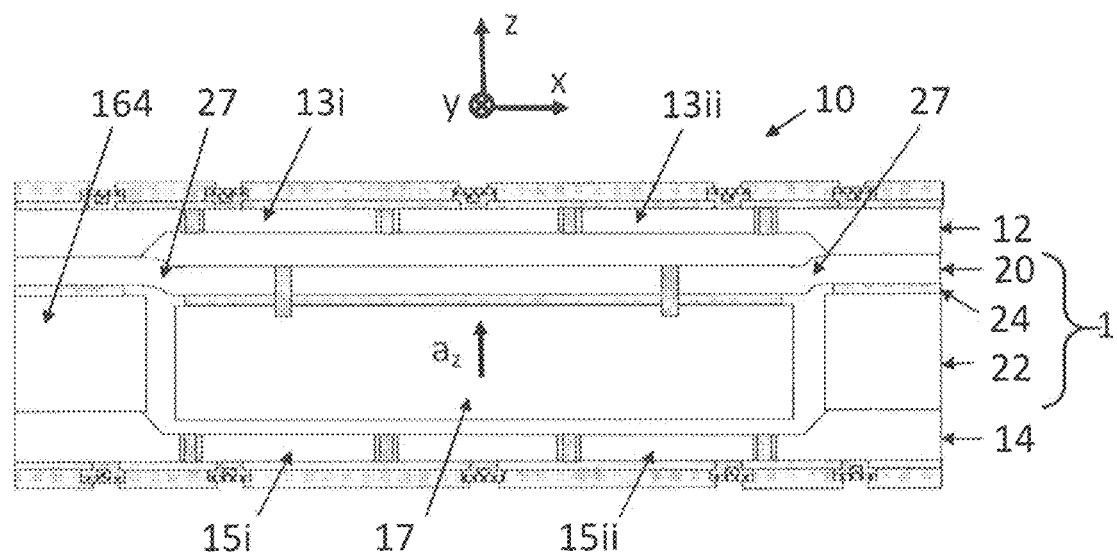
FIG. 4 is a cross-sectional view of the MEMS motion sensor of FIG. 2, showing the translation of the proof mass in response to acceleration in the z direction.

As shown in FIG. 4, acceleration along the z axis causes the proof mass 17 to translate vertically. Again the acceleration can be measured by monitoring the difference in capacitance between a pair of electrodes, for example, 13i and 15ii. The sensor thus includes different electrodes assemblies or sets to detect motion of the proof mass along the x, y and z axes. A first set of electrodes is configured to detect a rocking motion of the proof mass 17 about the y axis, indicative of an acceleration of the proof mass along the x axis. A second set of electrodes is configured to detect a rocking motion of the proof mass about the x axis, indicative of an acceleration of the proof mass along the y axis. Finally, a third set of electrode is configured to detect a translational motion of the proof mass along the z axis, indicative of an acceleration of the proof mass along the z axis.

FIG. 5 depicts a possible configuration of the electrodes in the MEMS motion sensor for the measurement of acceleration. Two pairs of top and bottom electrodes 13i, 15i and 13ii, 15ii are disposed along the x axis, on each side of the y axis and two pairs of top and bottom electrodes 13iii, 15iii and 13iv, 15iv are disposed along the y axis, on each side of the x axis.

Finally, the motion sensor includes a pair of top and bottom electrodes 13v and 15v. Electrode 15v is similar to electrode 13v, but hidden underneath proof mass 17. The electrodes 13v and 15v are aligned with the z axis, which is centered relative to the proof mass.

Of course, the electrode assemblies can be grouped and/or positioned differently, and include more or less electrodes, as long as they are able to detect motion of the proof mass in all three directions x, y and z.

In addition to detecting accelerations of the proof mass, the MEMS motion sensor can also be configured to detect angular rate or angular velocity (deg/sec). Typically, MEMS gyroscopes use vibrating mechanical elements to sense angular rotation via the Coriolis Effect. The Coriolis Effect arises when a mass M is moving at velocity $\vec{v}$ in a reference frame rotating with angular rate $\vec{\Omega}$. An observer sitting in the rotating frame perceives the mass to be deflected from its straight-line trajectory by the Coriolis Force, given by $\vec{F}_{Coriolis}=2M\vec{v}\times\vec{\Omega}$, where × denotes the vector cross-product.

In order to detect angular motion of the suspended proof mass, a periodic force is applied to the proof mass along one direction. When the sensor, and by extension the proof mass, is subjected to an angular rotation, a periodic Coriolis force proportional to the rate of rotation at the same frequency as the drive, but out of phase by 90 degrees, is induced along a direction perpendicular to both the drive signal and the axis of rotation. The magnitude of this motion can measured using capacitive sensing techniques.

The MEMS motion sensor can sense motion over 5 degrees of freedom (5 DOF), that is, accelerations along x, y and z axes, and angular velocity along the x and y axes. In this case, an electrode assembly is configured to vibrate the proof mass 17 at a drive frequency along the z axis, and two other electrode assemblies are configured to detect Coriolis-induced oscillations of the proof mass along the x and y axes, indicative of an angular motion of the proof mass with respect to the y and x axes, respectively.

Figure 6:
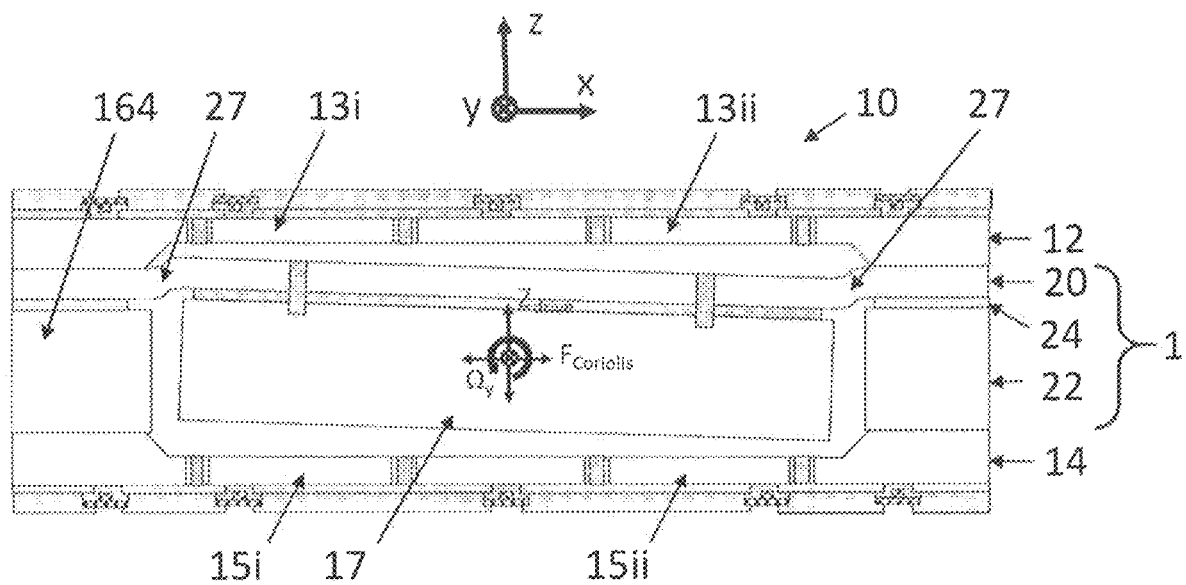
FIG. 6 is a cross-sectional view of the MEMS motion sensor of FIG. 2, showing the proof mass oscillating along the x axis while being driven at resonant frequency in the z direction, in response to the sensor being rotated around the y axis.

FIG. 6 illustrates the measurement of angular motion (or angular rate), in this case around the y axis (represented by a vector into of the page). The proof mass 17 is driven at the resonant frequency in the z-direction, $z=z_0 \sin \omega t$ with velocity $v_z=v_0 \cos \omega t$. If the sensor 10 rotates around the y axis at an angular rate of $\Omega_y$, the proof mass 17 will oscillate along the x axis ($\vec{a}_{Coriolis}=2\vec{v}\times\vec{\Omega}$) in response to the Coriolis acceleration, $a_{Coriolis}=2v_0\Omega_y \cos \omega t$. This motion can be measured using a Phase-Locked-Loop (PLL) as an oscillating differential capacitance in much the same way as the linear acceleration is measured. In a similar way, angular rate around the x axis can be measured at the same time by measuring the differential capacitance on the y axis electrodes in quadrature with the drive voltage.

Figure 7:
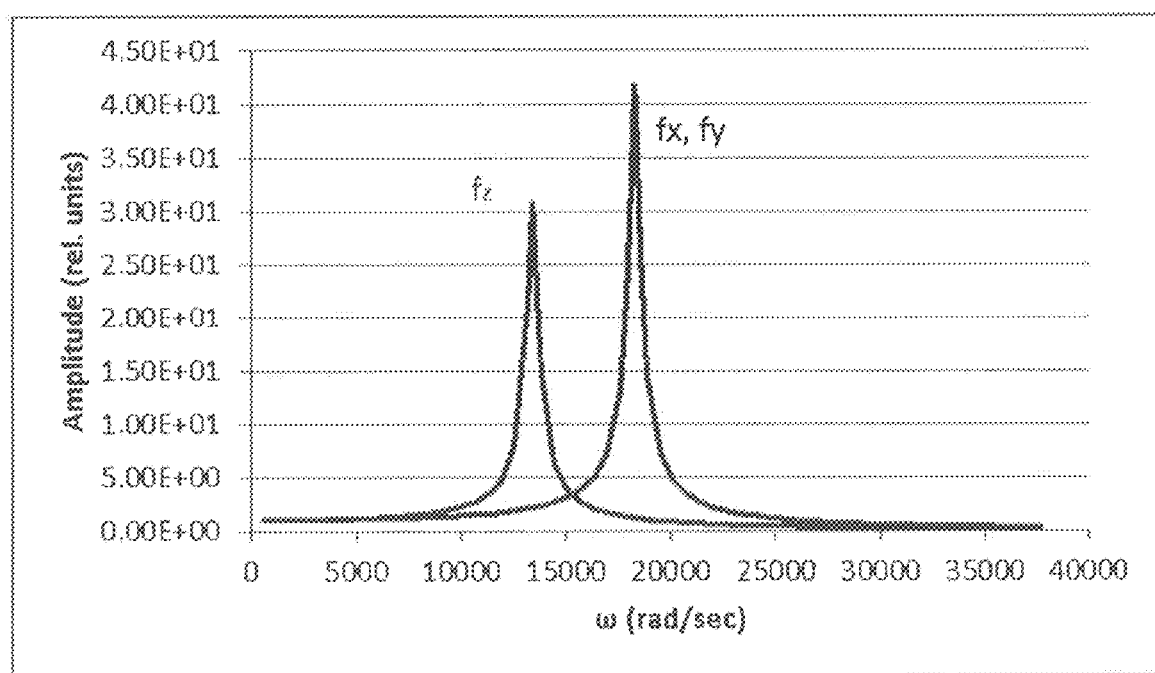
FIG. 7 is a graph showing the frequency response curves for off-resonance angular velocity measurement, with the resonant frequency of the proof mass in x or y ($f_x$ and $f_y$, respectively) being higher than the z resonant frequency $f_z$.

The resonant structure formed by the proof mass 17 and flexible springs 27 can be sized, shaped and configured to provide either matched or unmatched resonance conditions, depending on the objective sought. Referring to FIG. 7, for unmatched resonance conditions, the x and y sense measurements are made at the z drive frequency which is well below the x and y rocking resonances and are thus much less sensitive to temperature and other variations that can lead to bias drift. As shown in the graph of FIG. 7, the drive frequency at which the proof mass is vibrated, which in this case also corresponds to the resonant frequency $f_z$, is lower, than the resonant frequencies $f_x$ and $f_y$. In this possible embodiment, the proof mass and flexible springs are designed, shaped and configured so that the rocking frequencies $f_x$ and $f_y$ are higher than the vertical (z axis) drive frequency, such as 10-40% higher. In this configuration the sense measurement is made at the drive frequency $f_z$, which is well below the rocking resonance, $f_x$ or $f_y$.

Figure 8:
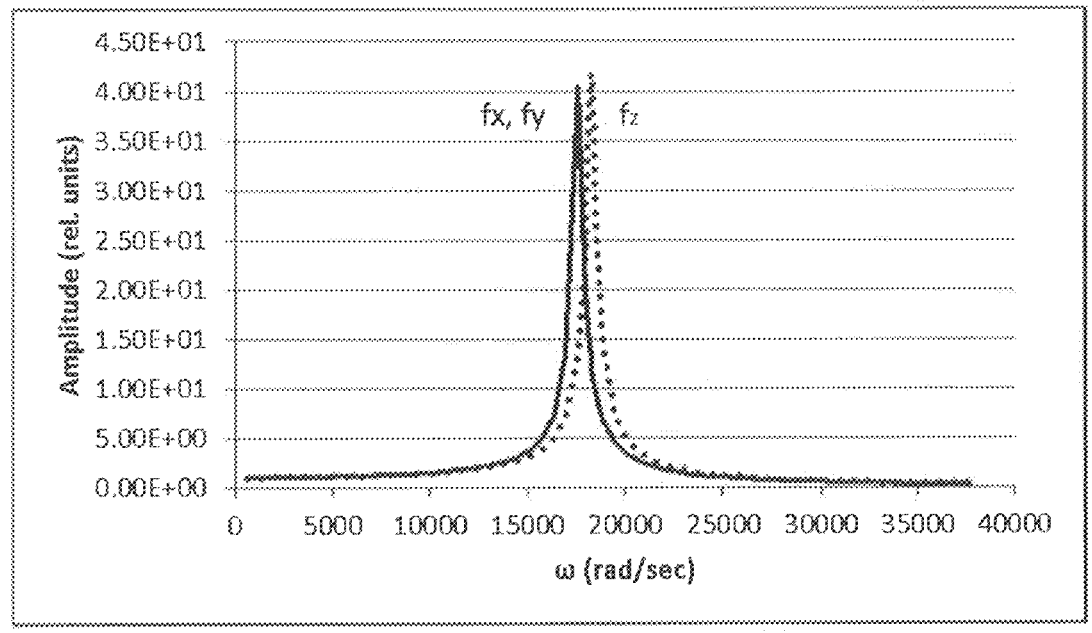
FIG. 8 is a graph showing the frequency response curves for matched or near-matched-mode angular velocity measurement, with the resonant frequency of the proof mass in x or y being similar to the resonant frequency $f_z$.

Referring now to FIG. 8, by increasing the lateral dimensions of the proof mass, the rocking frequencies $f_x$, $f_y$, can be increased until they are matched or nearly matched to that of the vertical frequency $f_z$, so that the mechanical gain of the rocking motion can be exploited for higher sensitivity. In this other embodiment, the resonant structure is shaped, sized and configured such that the resonant frequency $f_z$ is substantially identical to each of the respective resonant frequencies $f_x$, $f_y$, to provide matched resonance conditions. For example, the resonant structure can have respective resonant frequencies $f_z$, $f_x$, $f_y$ that are no more than 10% from one another, or alternatively within mutually overlapping 3 dB-bandwidths.

The ratios of the frequencies can be adjusted by modifying the ratios of the rocking moment of inertia to the total mass. The ratios of the rocking frequencies $f_x$, $f_y$ to the vertical resonant frequency $f_z$ depend chiefly on the ratio of the rocking moment of inertia to the mass, $$\text{Ratio}_{RZ} = \sqrt{\frac{\frac{K_{rot}}{J}}{\frac{K_Z}{M}}},$$

where $K_z$ is the z spring constant, J is the moment of inertia along one of the rocking axes, M is the mass, and $K_{rot}$ is the rotational spring constant, which for a four spring architecture is roughly $$K_{rot} \approx K_z \frac{S^2}{8},$$

with S being the width of the proof mass. So the frequency ratio reduces to $$\text{Ratio}_{RZ} \approx \sqrt{\frac{MS^2}{8J}} \approx \frac{1}{2\sqrt{2}}\sqrt{\frac{MS^2}{J}} \cdot r_G = \sqrt{\frac{J}{M}}$$

is the definition of the radius of gyration, the distance from the axis of rotation of an extended object at which its mass, if concentrated into a point mass, would have the same moment of inertia as the extended object, i.e. appear as a simple pendulum. In other words, =Mr$_G^2$, so $$\text{Ratio}_{RZ} \approx \frac{1}{2\sqrt{2}} \frac{S}{r_G}.$$

Thus, to operate non-resonantly and ensure that the rocking frequency f$_r$ (f$_x$, f$_y$) is higher than the resonant frequency f$_z$, the proof mass can be designed such that $$r_G < \frac{S}{2\sqrt{2}}.$$

For proof masses with large lobes, J is large (i.e. large radius of gyration), so the rocking frequency f$_x$ or f$_y$ is lower than the z frequency f$_z$. Low moment of inertia is obtained when most of the mass is concentrated beneath the axis. This occurs more naturally for proof masses with simple or "regular" cross sections. Similarly, to have the y rocking frequency f$_y$ higher than the x rocking frequency f$_x$, the y axis moment of inertial must be smaller than the x axis moment. This can be accomplished by reducing the proof mass width along the y axis relative to the x axis.

In another embodiment, it is possible to measure angular motion about the z axis as well. In this case the MEMS motion sensor detects motion over 6 degrees of freedom (6 DOF). The x and y angular velocities are measured separately from the z angular velocity. Existing surface micromachined MEMS gyroscopes having small proof masses and sense electrodes require the gyroscope to be operated in a resonant sense mode. Advantageously, the MEMS motion sensor of the present invention can be operated in either a resonant or a non-resonant mode, due to the relatively large proof mass and sense electrodes. For higher sensitivity, the MEMS motion sensor is preferably designed with matched resonant frequencies f$_x$, f$_y$ and f$_z$. Alternatively, to reduce the impact temperature, fabrication, and phase sensitivities which are exacerbated by working near the peak of the sense frequency response curve, the MEMS motion sensor can be designed with non-matched resonant frequencies.

The angular velocity around the 6$^{th}$ or z axis is measured in a different way since the drive axis must be along an orthogonal axis. In this case, one of the first and second electrode assemblies is configured to vibrate the proof mass at a drive frequency along a corresponding one of the x and y axes, respectively, the first electrode assembly being configured to detect Coriolis-induced oscillations of the proof mass along the other one of the x and y axes, indicative of an angular motion of the proof mass about the z axis. Preferably, the drive frequency along the corresponding one of the x and y axes corresponds to a respective one of the resonant frequencies f$_x$ and f$_y$.

Figure 9:
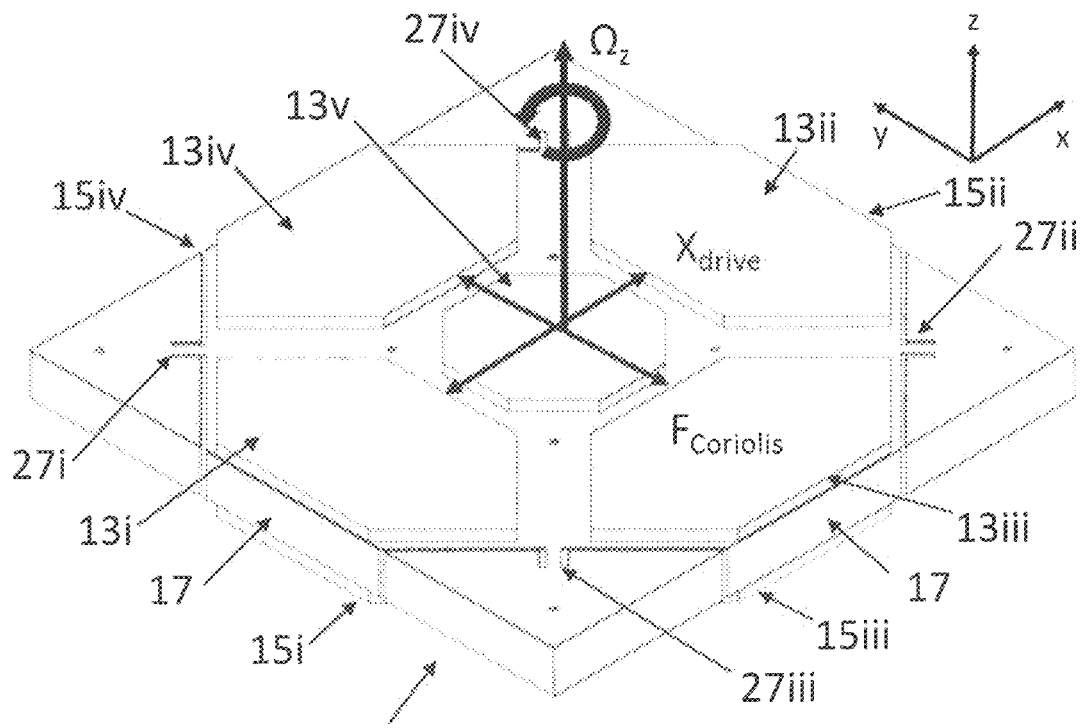
FIG. 9 is a partial perspective view of a motion sensor showing the electrodes and proof mass, for measuring angular velocity around the z axis.

The proof mass is driven along one of the lateral axes, e.g. the x-axis, at the rocking frequency, such as shown in FIG. 9. This rocking motion can be excited by applying an alternating voltage, such as a sine wave or square wave on pairs of electrodes, with alternate top and bottom electrodes in parallel, e.g. using a first electrode assembly formed by 13$i$ and 15$ii$ alternating with another electrode assembly formed by 13$ii$ and 15$i$. In this way, there is no net vertical displacement of the proof mass 17. The rocking motion causes the center of mass 17 to oscillate along the x axis. The angular velocity around the z axis is manifested as a quadrature signal at the rocking frequency along the y axis and can be measured using an electrode assembly along the y axis, such as 13$ii$ and 13$iv$.

Figure 10:
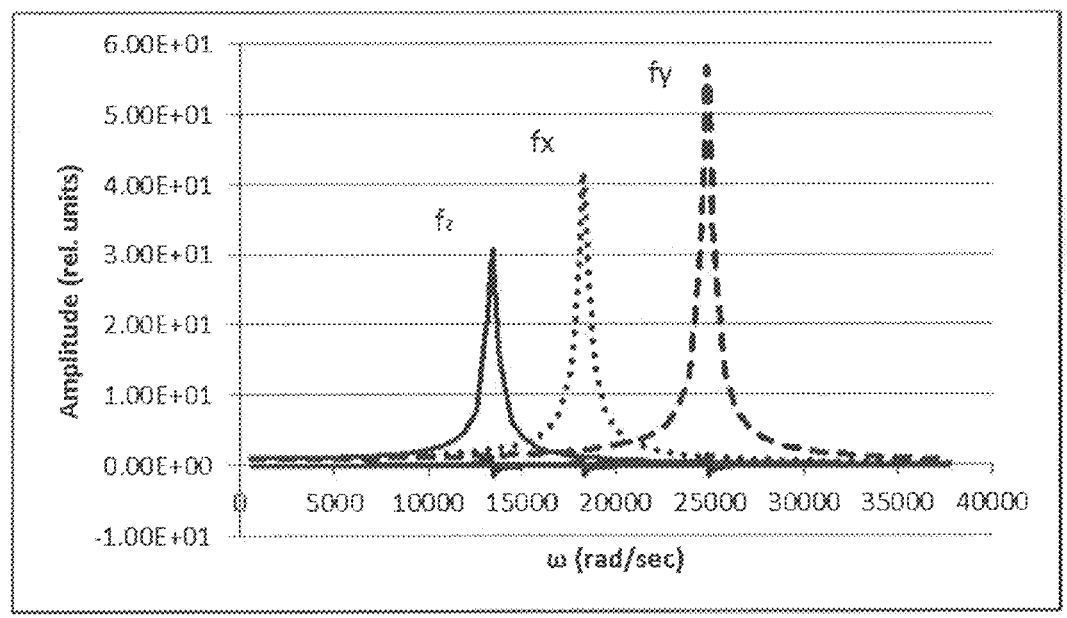
FIG. 10 is a graph showing frequency response as a function of angular velocity for a proof mass with different resonant frequencies $f_x$, $f_y$, and $f_z$.

For a symmetric proof mass, the x and y rocking modes occur at the same frequency, so a matched-mode angular rate measurement is more natural, such as shown in FIG. 8. This approach can be sensitive to dimensional variations, especially through temperature variation, signal bandwidth, and to the phase variations which occur at resonance. Alternatively, in order to operate in a non-resonant sensing mode for z angular rate, the lateral dimensions of the proof mass can be adjusted asymmetrically e.g. wider along one lateral direction than the other, so that the x and y rocking frequencies f$_x$ and f$_y$ are different, such as shown in FIG. 10. In this case, the resonant structure is shaped, sized and configured with each of the resonant frequencies f$_x$, f$_y$ and f$_z$ being substantially different. For example, the resonant frequencies f$_x$, f$_y$ and f$_z$ can have mutually non-overlapping 3 dB-bandwidths.

It will be appreciated that in either one of the matched or unmatched resonant modes, the resonant structure is shaped, sized and configured such that each of the resonant frequencies f$_x$, f$_y$ and f$_z$ is substantially higher than sensing frequencies at which the electrode assemblies are configured to detect the motion of the proof mass in response to accelerations of the proof mass along to the x, y and z axes, respectively.

Depending of the application of the MEMS motion sensor (3 DOF accelerometer and/or 5 DOF or 6 DOF gyroscope) some of the top and/or bottom electrodes are connectable to driving means, and other ones of the top and/or bottom electrodes are connectable to sensing means. The top and bottom electrodes can also be reconfigurably connectable to driving and sensing means, for switching between drive and sense modes. The terms "driving means" and "sensing means" refer to any electronic circuitry configured to transmit and/or read electric signals.

The proof mass can take different shapes, such as a cross-shape as shown in FIG. 5, or alternatively the proof mass can be shaped as a convex polygonal prism, which is preferably regular. In order to concentrate the mass near the center of gyration, the proof mass can be shaped as an octagonal prism, such as shown in FIG. 9, with four flexible springs on opposed sides, positioned in line with the corners of the proof mass.

As shown in any one of FIGS. 1 to 6, the top and bottom cap wafers 12, 14 have respective thicknesses, the top and bottom electrodes 13, 15 extend through the entire thicknesses of the top and bottom cap wafers, respectively. The top, MEMS and bottom wafers 12, 16, 14 are typically made of silicon-based semiconductor and the MEMS wafer is preferably a silicon-on-insulator (SOI) wafer, with an insulating layer 24 separating the device layer 20 from the handle layer 22. In the embodiments illustrated, the proof mass is patterned in both the device and the handle layers 20, 22 and the top and bottom electrodes 13, 15 are delimited by insulated channels.

Figure 11A:
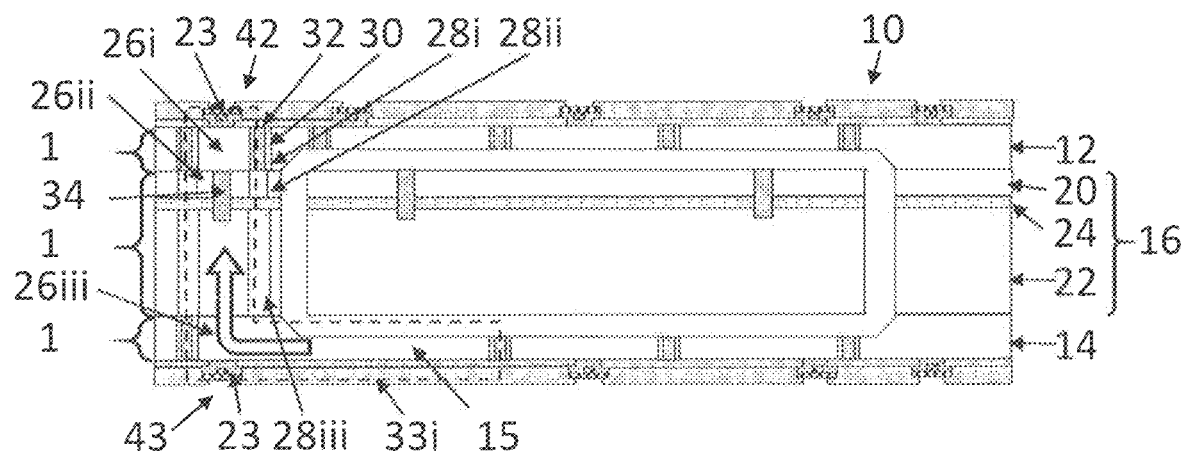
FIGS. 11A to 11D are different cross-sectional views of the MEMS motion sensor of FIG. 1, each view showing an insulated conducting pathway through the MEMS motion sensor.
Figure 11B:
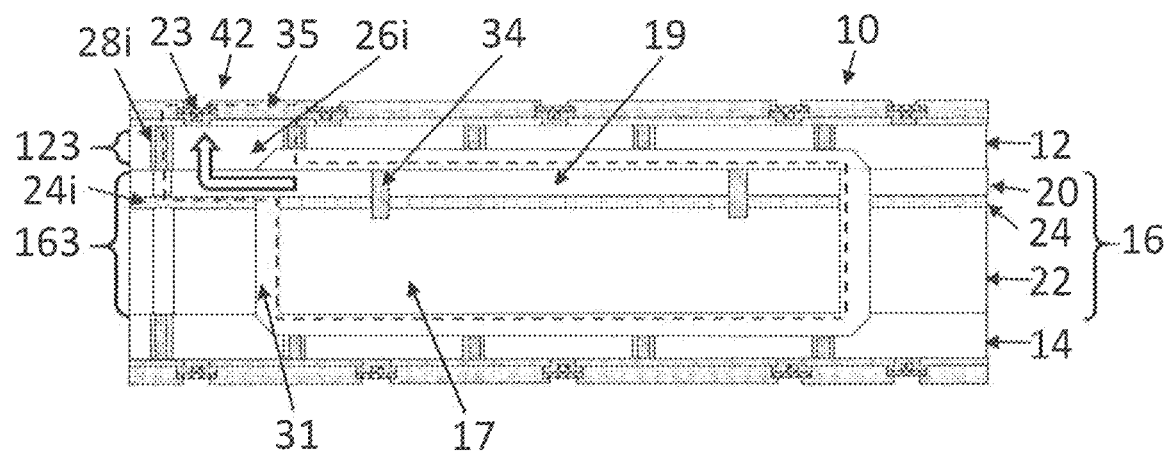
Figure 11C:
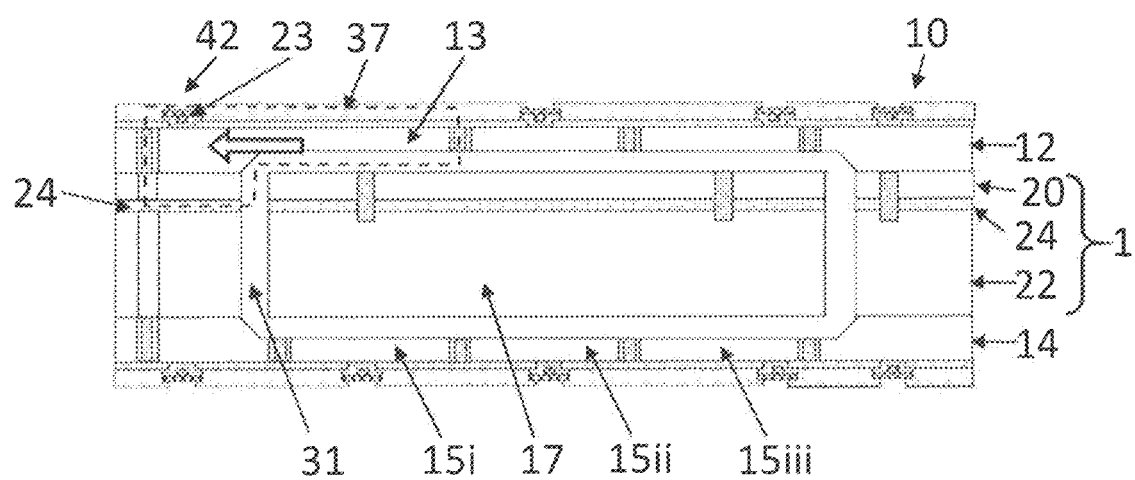
Figure 11D:
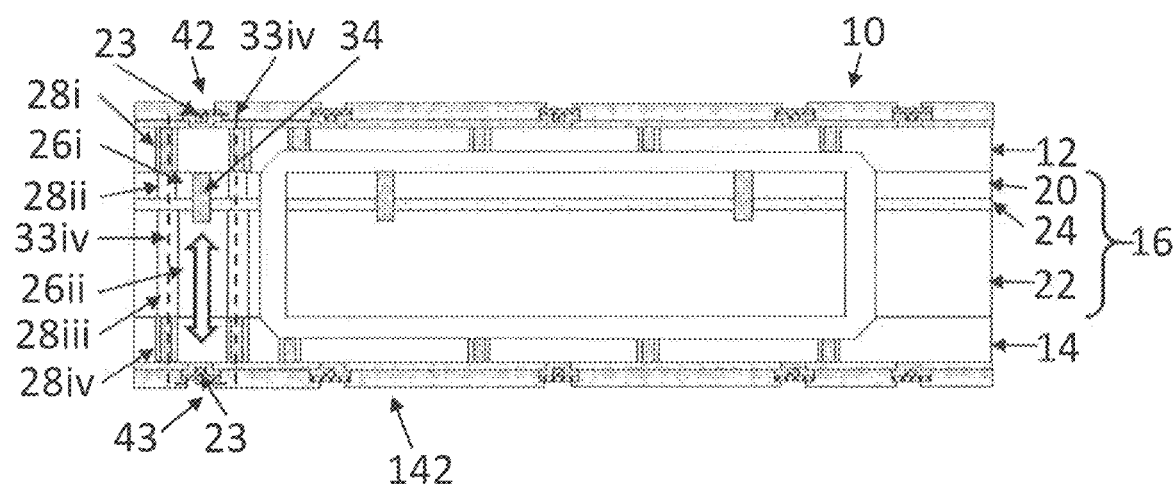

Referring now to FIGS. 11A-11D, these cross sectional views show different insulated, electrically conducting pathways provided in the MEMS motion sensor 10. It is desirable to electrically connect the top cap wafer 12, the MEMS wafer 16 (in this case including the device and handle layers 20, 22) and the bottom cap wafer 14 for different reasons, as will be explained in more detail below. One or more of the insulated conducting pathways include at least a portion extending through the entire thickness of one of the top cap wafer, MEMS wafer, or bottom cap wafer. Some of the insulated conducting pathways are formed by a top cap wafer channel 123, a MEMS wafer channel 163 and a bottom cap channel 143, these channels being aligned at the wafer interfaces (such as shown in FIGS. 11A and 11D) to form the conducting pathways. One or more additional insulated conducting pathways extend through the MEMS wafer 16 and through the top cap wafer 12 only (as shown in FIG. 11B), while yet other additional insulated conducting pathway(s) 37 extend through the top cap wafer only (as shown in FIG. 11C).

Referring to FIG. 11A, it is desirable to isolate one or more bottom cap electrodes 15 and independently feed them up through the MEMS wafer 16 and the top cap wafer 12 to the bond pad 23 on the top cap wafer 12, to electrical contacts 42 part of a given set of contacts. The insulated conducting pathway 33$i$ comprises a top cap wafer channel 123, a MEMS wafer channel 163 and a bottom cap wafer channel 143, the three channels being electrically connected. The top cap wafer channel 123 is formed by a trench 28$i$ surrounding a conductive wafer plug 26$i$, the trench 28$i$ being filled with an insulating material 30 to isolate the wafer plug 26$i$. More specifically, the trench 28$i$ has its sidewall coated with the insulating material 30 and optionally the inside of the trench 28$i$ is filled with a conducting material 32 (best shown enlarged in FIG. 12C). The MEMS wafer channel 163 consists of wafer plugs 26$ii$, 26$iii$ surrounded by closed trenches 28$ii$, 28$iii$. The trenches 28$ii$, 28$iii$ are patterned in the device and handle layers 20, 22 of the MEMS wafer 16. A SOI conducting shunt 34 electrically connects the device and handle layers (and more specifically the plugs 26$ii$ and 26$iii$), allowing signals to transit through the entire thickness of the MEMS wafer 16. The bottom cap wafer channel 143 is connected to (or forms part of) the bottom cap electrode 15. The insulated conducting channel 33$i$ thus connects the bottom cap electrode 15 and the electrical contact 42 on the top cap wafer 12. This pathway 33$i$ can be used to transmit signals to and from the bottom cap electrode 15, for example to detect a change of capacitance between the top and bottom electrodes 13, 15 when the proof mass 17 moves. Optionally, an electrical contact 43 (in the form of a bond pad 23) can be provided in the bottom cap wafer 14 as well, allowing transmitting signals to/from the bottom cap electrode 15 to the electrical contact 43. It is worth noting that for clarity, not all electrodes are identified in the MEMS device. Of course, some or all of the bottom cap electrodes can be connected to similar insulated conducting pathways.

Referring to FIG. 11B, it is also desirable to be able to isolate parts of the device layer 20 only, such as for MEMS electrodes 19 provided in the device layer. It is also desirable to isolate portions of the device which extend through the entire thickness of the MEMS wafer 16 (combining the handle layer 22, the device layer 20, and the insulating layer 24) in order to feed signals from the proof mass 17 through the top cap wafer 12 to electrical contacts (such as bond pads). In FIG. 11B, an additional insulated conducting pathway 35 extends through the MEMS wafer 16 and through the top cap wafer 12, connecting the pendulous proof mass 17 to one of the electrical contacts 42 on the top cap wafer 12. In this case, this additional insulated conducting pathway 35 includes a top cap wafer channel 123 and a MEMS wafer channel 163. The top cap wafer channel 123 is formed by a wafer portion 26$i$ surrounded by a closed trench 28$i$, the trench 28$i$ being filled with an insulating material and optionally with a conducting material. The MEMS wafer channel 163 is delimited in part by a portion of the buried oxide layer 24$i$ and by the cavity 31 housing the proof mass 17. A SOI conducting shunt 34 allows connecting the device and handle layers in the MEMS structure 17. Given that the bond between the top cap wafer 12 and the MEMS wafer 16 are conductive, the top cap wafer channel 123 and the MEMS wafer channel 163 are electrically connected, and thus form the additional insulated conducting pathway 35. This pathway can be used, for example, to send a signal to the proof mass 17.

Referring to FIG. 11C, top cap electrodes 13 on the top cap wafer 12 can also be isolated and connected to electrical contacts 42, part of a different set of contacts. This is done with other additional insulated conducting pathways, extending through the top cap wafer 12 between the top cap electrodes 13 and the bond pads 23. In FIG. 11C, an example of such a pathway, identified with reference 37, permits the transmission of electrical signals between the top cap electrode 13 and the corresponding electrical contact 42, in this case the bond pad 23. The insulated conducting pathway 37 is delimited in part by the buried oxide forming the insulating layer 24 and by the cavity 31.

Referring to FIG. 11D, electrical contacts 43, such as bond pads, can also be located on bottom cap 14 to pass signals through the MEMS device 10, for example, from an Integrated Circuit (IC) on top, through the MEMS device 10, to an underlying IC or Printed Circuit Board (PCB). The outer side 142 of the bottom cap wafer 14 has electrical contact(s) 43, such as bond pads 23, and the insulated conducting pathways is a device feedthrough 25 extending from the electrical contacts 42 on the top cap wafer 12 to the electrical contacts 43 on the bottom cap wafer 14. The insulated conducting pathway is formed in the top and bottom cap wafers 12, 14 by trenches 28$i$, 28$iv$ filled with an insulating material, and optionally with a conducting material inside the insulated trenches; and by trenches 28$ii$, 28$iii$ formed in the device and handle layers 20, 22. The trenches 28$ii$, 28$iii$ surround respective silicon wafer plugs 26$i$, 26$ii$, connected by an SOI conducting shunt 34.

Manufacturing Method

The motion sensor is a multi-wafer stack consisting of top and bottom cap wafers containing sense electrodes and the center MEMS wafer containing the proof mass and springs. As described previously, the stack is combined with insulated conducting pathways, which can also be referred to as electrically isolated "3 dimensional through-chip vias" (3DTCVs) to route signals from electrodes on the bottom cap and MEMS wafer through the MEMS wafer to and through the top cap wafer to bond pads on the surface, thus providing a means of monitoring the position of the proof mass in three-dimensional space.

The method for manufacturing the MEMS device will be described in connection with a preferred embodiment. However, it will be understood that there is no intent to limit the invention to the embodiment described.

Referring to FIGS. 12, 12A-11B, 13 and 13A, to begin construction of the MEMS motion sensor according to a possible embodiment, top and bottom cap wafers are provided. The top wafer 12 has an inner side 121 and an outer side 122, and the bottom cap wafer 14 has an inner side 141 and an outer side 142. The top and bottom cap wafers 12, 14 are preferably silicon-based wafers. Insulated conducting cap wafer channels 123, 143 are formed on the inner sides 121, 141 of the cap wafers 12, 14. Trenches 28 are patterned on the inner sides 121, 141, the trenches 28 extending only partially through the cap wafers 12, 14. The trenches 28 of the top and bottom cap wafers 12, 14 are then filled with an insulating material 30, and optionally with a conducting material 32 as well (as best shown in FIG. 12C). For some embodiments of the device, it may be required to pattern a recess 38, at least in the top cap wafer 12 to form part of a cavity which will eventually house the proof mass. The bottom cap wafer 14 can also be patterned with a similar recess 38. The top cap wafer 12 can also be patterned with trenches 28, and the trenches 28 being filled with an insulating material to form top cap electrodes 13 and/or leads. Preferably, the bottom cap wafer is also patterned is a similar fashion to create bottom cap electrodes 15 and leads. Numerous processes are available at different MEMS fabrication facilities and the insulating and conducting materials 30, 32 vary between them. In this embodiment, islands of conducting wafer (typically silicon) in the shape of the channels 123, 143 and electrodes 13, 15 are surrounded by insulating barriers, patterned into the silicon with a sufficient depth greater than the final desired cap thickness.

Referring to FIGS. 14, 14A-14B, a MEMS wafer 16 is provided, having first and second sides 161, 162. Portions of the proof mass and the four flexural springs, and portions of insulated conducting MEMS wafer channels, are patterned in the first or top side 161 of the MEMS wafer 16. It would also be possible to first pattern the second or bottom side 162 instead. In this embodiment, the MEMS wafer 16 is an SOI wafer with an insulating layer 24 separating the device layer 20 from the handle layer 22. SOI conducting shunts 34 are formed through the device layer 20 and the insulating layer 24 (typically buried oxide), by first opening vias in the device and insulating layer 20, 24, and possibly slightly in the handle layer 24, and by filling the vias with a conducting material, such as doped polycrystalline silicon (polysilicon), metal, or other conducting material. In this way, a SOI conducting shunt 34 is formed vertically between the device and handle layers 20, 22 at desired spots.

Referring to FIGS. 15 and 15A, trenches 28 surrounding some of the SOI conducting shunts 34 are etched for forming the portions of insulated conducting MEMS wafer channels (such as feedthoughs). In some embodiments, this step can include etching trenches 28 in the device layer 20 for forming other MEMS structures and elements.

Figures 16, 16A:
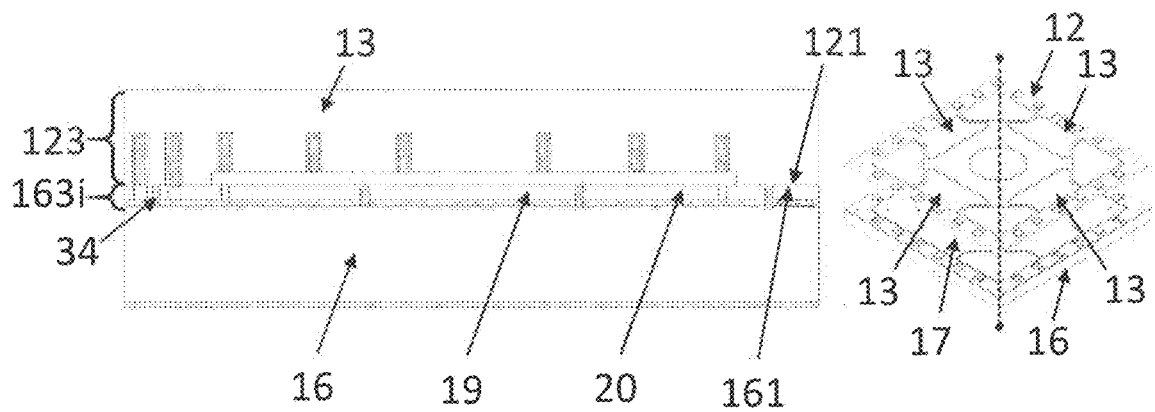
FIG. 16 is an exploded view of the top cap wafer of FIG. 12 and of the MEMS wafer of FIG. 15.
FIG. 16A is a cross-sectional view of the top cap wafer bonded to the MEMS wafer, showing the alignment of the top cap wafer with the first side of the MEMS wafer, which in this embodiment corresponds to the device layer side.

Referring to FIGS. 16 and 16A, the side of the MEMS wafer patterned in the previous step is bonded to the inner side of the top or bottom cap wafer by aligning the insulated conducting cap wafer channels of the cap wafer 12 with the remaining portions of the insulated conducting MEMS channels 163i. In this example, it is the first side 161 of the MEMS wafer that is bonded to the top cap wafer 12. Of course, it would have been possible to first pattern the handle layer and to bond it with the patterned bottom cap wafer. Bonding the top cap wafer 12 to the first side 161 of the MEMS wafer 16 is done with a conductive bond. Preferably, fusion bonding is used, but other alternatives can be considered, such as using a conducting material. Bonding can be made for example using gold thermocompression bonding, or gold-silicon eutectic bonding. In this embodiment where the MEMS wafer is a SOI wafer, the top cap wafer 12 is aligned and bonded to the SOI device layer 20 on the MEMS wafer 16. The feedthrough pads on the SOI Device layer 20 are aligned to the corresponding pads on the top cap wafer 12 and the electrodes 13 on the top cap wafer 12 are aligned to the relevant electrodes 19 on the MEMS wafer 16.

Figures 17, 17A:
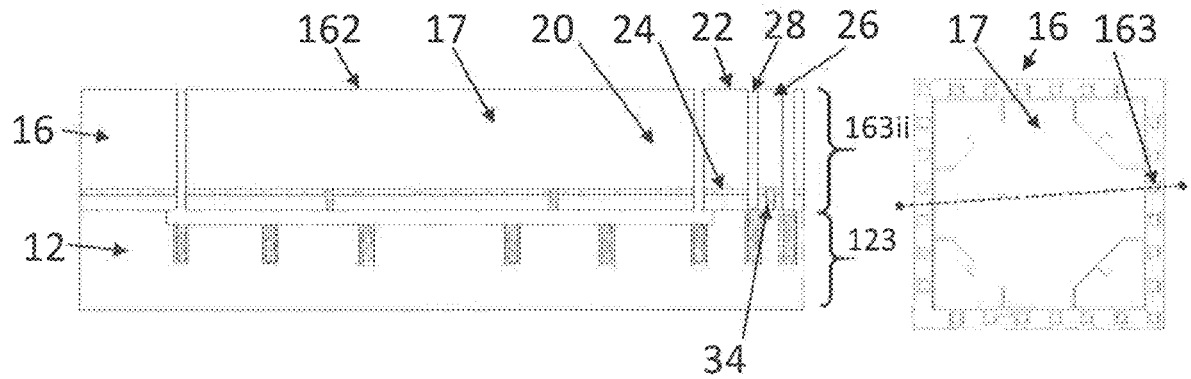
FIG. 17 is a top view of the second side of the MEMS wafer, which in this embodiment corresponds to the handle layer side.
FIG. 17A is a cross-sectional view of the MEMS wafer bonded to the top cap wafer, turned upside down, for patterning the remaining portion of the proof mass and of the MEMS wafer channels in the handle layer.

Referring to FIGS. 17 and 17A, the remaining portions of the proof mass 17 and the remaining portions 163ii of the insulated conducting MEMS wafer channels 163 are patterned on the other side 162 of the MEMS wafer 16. This step can be conducted by etching trenches 28 to form the remaining portion of the proof mass 17 and to form conductive wafer plugs 26 part of the insulated conducting MEMS wafer channel 163. In the present example, the other side corresponds to the handle layer 22, and the proof mass and electrodes are aligned to similar elements, such as electrodes and springs on the device layer 20.

In this example, the MEMS wafer channel 163 will eventually form part of a device feedthrough, located in the periphery of the handle layer 22. Trenches 28 are etched around the conductive silicon wafer plug 26 to isolate it from the rest of the layer 22. The SOI conducting shunt 34 in the device and insulating layers 20, 24 provides electrical conductivity within the channel 163. If there were no shunt 34, the silicon plug would merely be a mechanical support.

Figures 18, 18A:
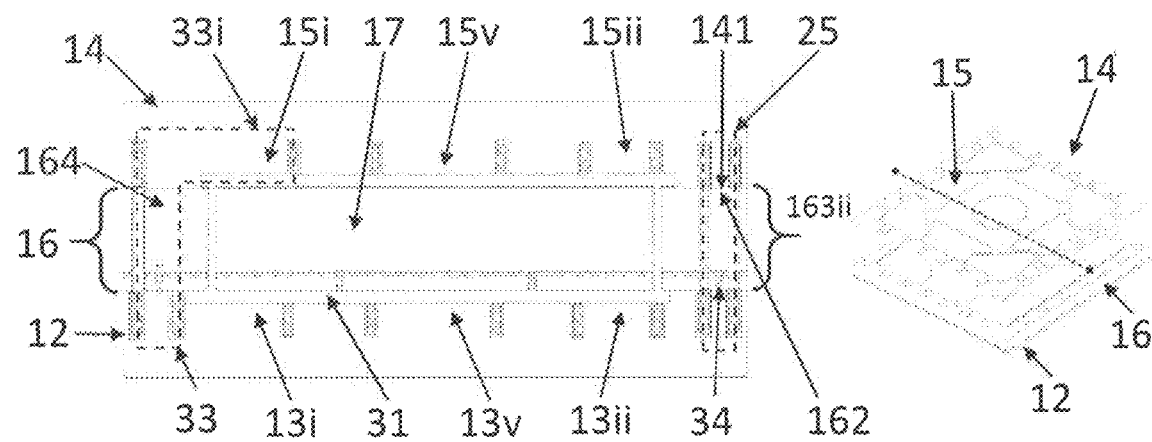

Referring to FIGS. 18 and 18A, the side 162 of the MEMS wafer 16 patterned in the previous step is next bonded to the inner side 141 of the other cap wafer, which in this case is the bottom cap wafer 14. The bonding step is made by aligning the electrodes of the top cap wafer 12 with the electrodes of the bottom cap wafer 14. As illustrated, electrodes 13i, 13ii and 13v are aligned with electrodes 15i, 15ii and 15v. The insulated conducting cap wafer channels are also aligned with the remaining portions of the insulated conducting MEMS channels, creating insulated conducting pathways. Some of the insulated conducting pathways, such as pathway 33i, extend from an electrode 15i in the bottom cap wafer 12, through the outer frame of the MEMS wafer 16 and through the top cap wafer 14. The caps 12, 14 thereby enclose the proof mass 17 which is suspended by springs (not shown in FIG. 18A) relative to the outer frame 164 within the cavity 31, formed by the top and bottom cap wafers 12, 14 and by the outer frame 164 of the MEMS wafer 16.

Similar to the bonding of the other cap wafer, the bond is a conductive bond, which can be performed using various bonding method such as fusion bonding or bonding with a conducting material, such as gold thermocompression bonding or gold-silicon eutectic bonding for example. The bond is used to provide electrical contact between the channels in the MEMS wafer and the channels in the cap wafer 14, some of which are connected electrically to the bottom electrodes 15. In this manner, a conductive pathway 33i is provided from a bottom electrode 15 through the bottom cap silicon pad, handle feedthrough, SOI conducting shunt, and SOI device layer pad to the top cap wafer pad. At this point the MEMS wafer 16 is hermetically sealed between the cap wafers 12, 14. The proof mass is aligned with electrodes of the top cap and/or bottom cap and/or any handle side electrodes. Because the insulating channels do not yet fully penetrate the caps, the electrodes (such those illustrated—13i, 13ii, 13v and 15i 15ii and 15v) on each cap are shorted together through the remaining silicon.

Figures 19, 19A:
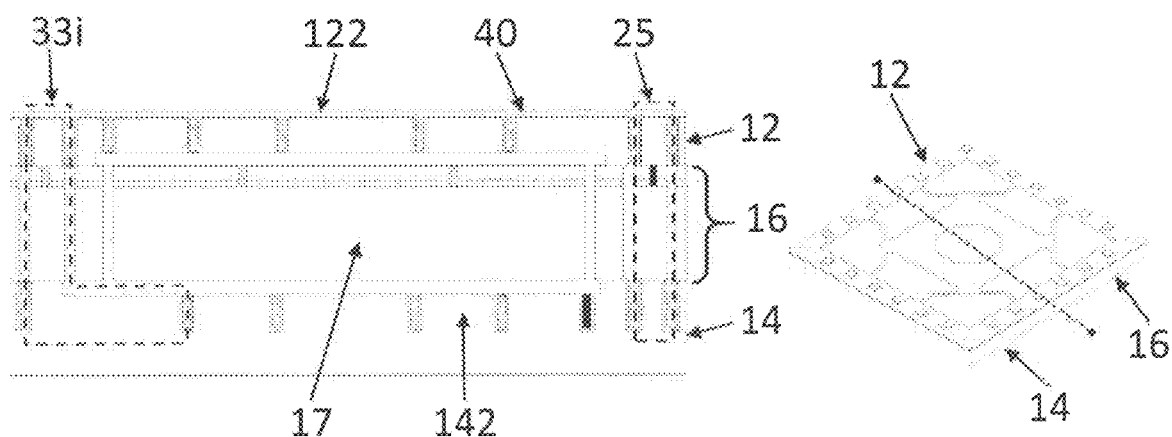
FIG. 19 is a top perspective view of the MEMS motion sensor.
FIG. 19A is a cross-sectional view of the MEMS motion sensor during its manufacturing, after grinding, polishing, and passivation of the top cap wafer.

Referring to FIG. 19A, a portion of the outer sides 122, 142 of the top and bottom cap wafers 12, 14 is removed to expose and isolate the insulated conducting pathway 33i and feedthrough 25. This step can be conducted by grinding and polishing the outer sides of the top and bottom cap wafers. Preferably, the outer sides of the top and bottom cap wafers 12, 14 are electrically passivated with a cap insulating layer 40. In the example shown, only the side 122 of the top cap is removed and passivated, since other optional steps are conducted afterwards. It should be noted that it is possible to grind the outer side of both the top and bottom cap wafers, passivate them, and stop the process at this point, such that the next steps are performed later, in the same or in a different plant. Indeed, in this step, insulated conducting pathways are formed which extend from the bottom cap wafer, through MEMS wafer, to the cap wafer.

However, manufacturing the MEMS motion sensor 10 typically comprises the step of forming electrical contacts on at least the outer side 122 of the top cap wafer 12. The electrical contacts on the top cap are connected with the insulated conducting pathway 33*i* and feedthrough 25, and allow to route electrical signals from the bottom cap wafer 14 to the electrical contacts on the top cap wafer 12. Preferably, the method further comprises forming electrical contacts on the outer side 142 of the bottom cap wafer 14 as well. These electrical contacts 43, being connected to some of the insulated conducting pathway 33*i*, allow the routing of electrical signals from the conducting pathway 33*i* to the electrical contacts on the bottom cap wafer 14.

This step of forming electrical contacts on the outer sides of the top and/or bottom cap wafers can be accomplished as follows. The procedure is illustrated for one side of the MEMS device only, but of course the same steps can be performed on the other side as well.

Figure 20:
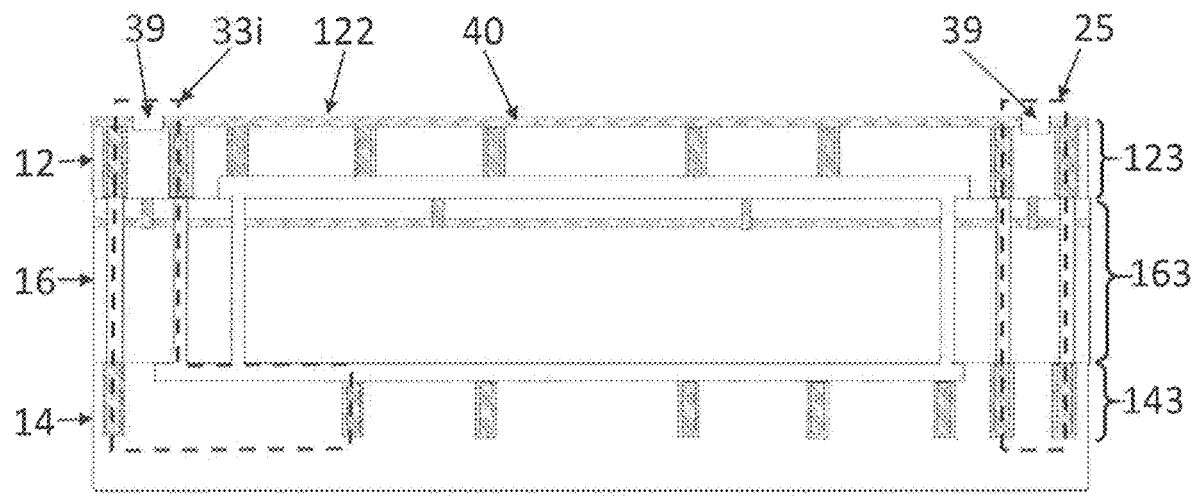
FIG. 20 is a cross-sectional view of the MEMS motion sensor of FIG. 18A, after opening contacts in the cap insulating layer of the top cap wafer, for connection with the insulated conducting pathways.

Referring to FIG. 20, openings 39 are created in the cap insulating layer 40 on the outer side 122 of cap wafer 12, in line with the insulated conducting wafer cap channels 123.

Figure 21:
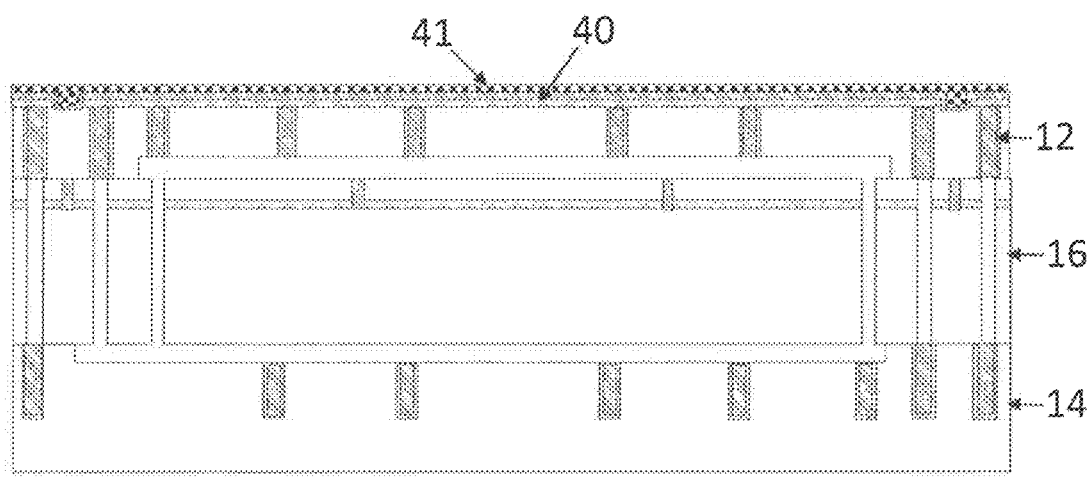
FIG. 21 is a cross-sectional view of the MEMS motion sensor of FIG. 20, after applying a metallic layer on the cap insulating layer.
Figure 22:
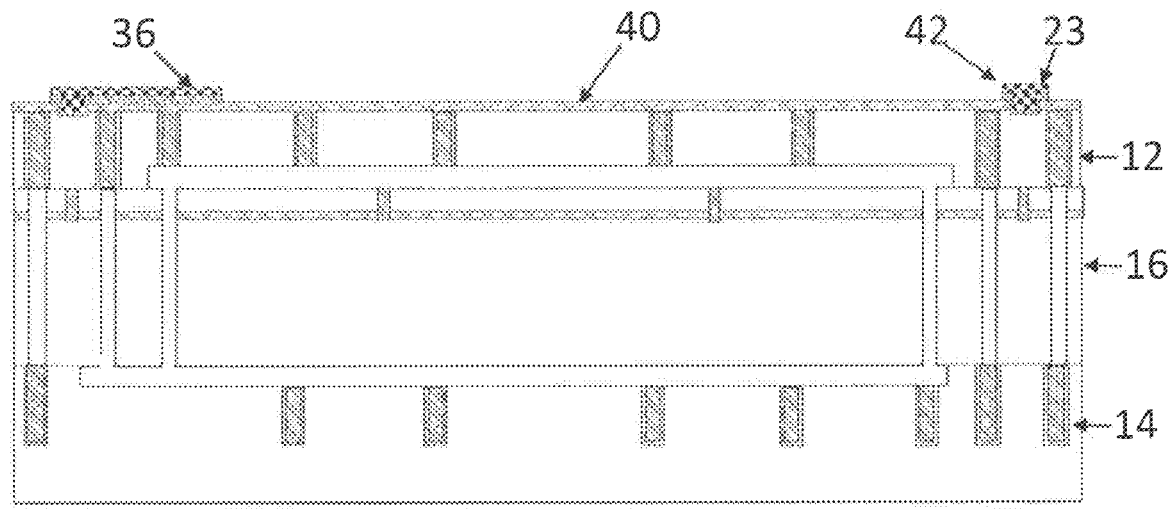
FIG. 22 is a cross-sectional view of the MEMS motion sensor of FIG. 21, after patterning the metallic layer to leave bond pads and leads.
Figure 23:
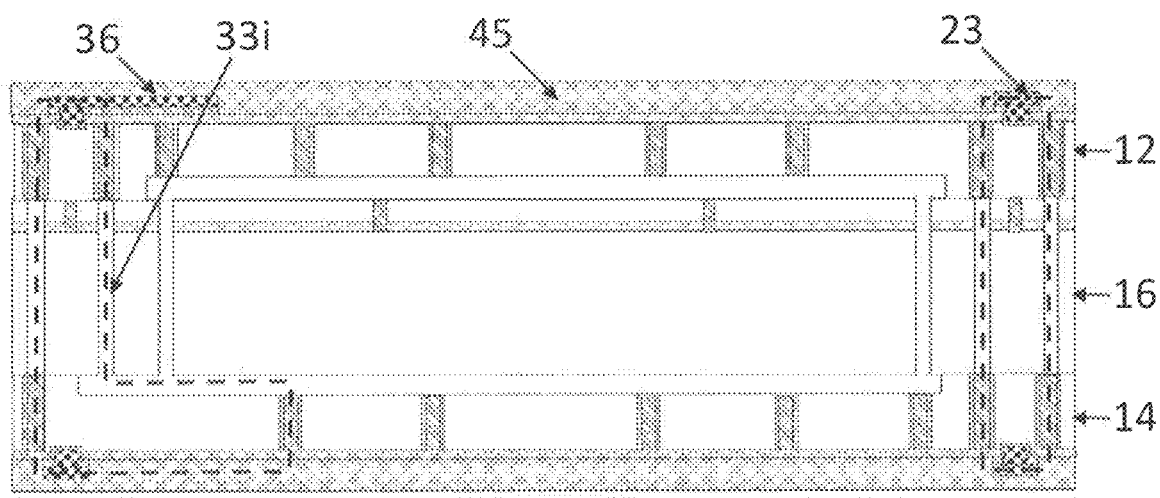
FIG. 23 is a cross-sectional view of the MEMS motion sensor of FIG. 22, after applying a passivating film over the electrical leads and bond pads.
Figures 24, 24A:
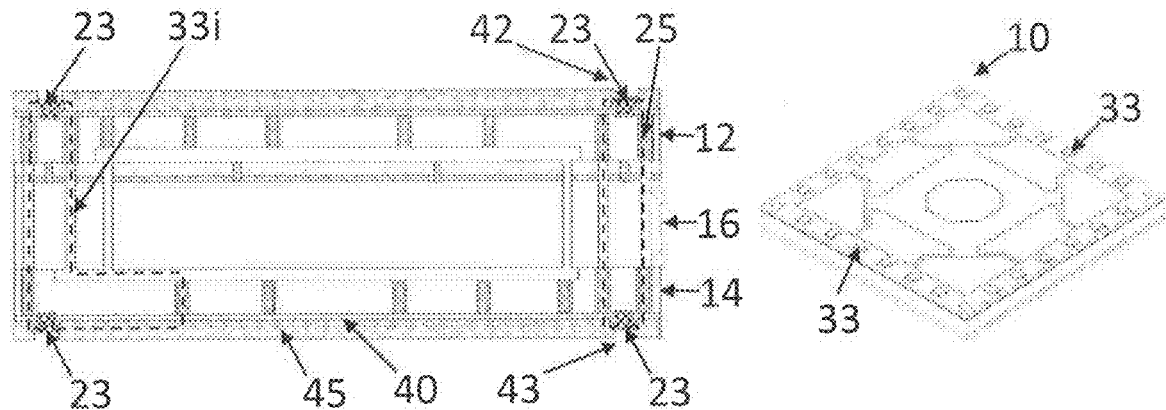

Referring to FIG. 21, a metallic layer 41 is applied on the cap insulating layer 40. As shown in FIG. 22, the metallic layer 41 is then patterned to form electrical leads 36 and bond pads 23. Finally, as shown in FIG. 23, a passivating film 45 is applied over the electrical leads 36 and the bond pads 23. The passivating film protects electrical leads 36 which can extend along the top surface of the cap wafers. At this point, if electrical contacts are desired in the bottom cap, the process steps shown in FIGS. 20 through 23 can be repeated on the bottom wafer as further shown in FIG. 23. As shown in FIG. 24A, openings are then created in the passivating film 45 over the bond pads 23. In this way, the insulated conducting pathways from the top, sides, and bottom of the MEMS device are accessible from at least the top cap wafer 12 for wire bonding, flip-chip bonding, or wafer bonding.

Figures 25A, 25B:
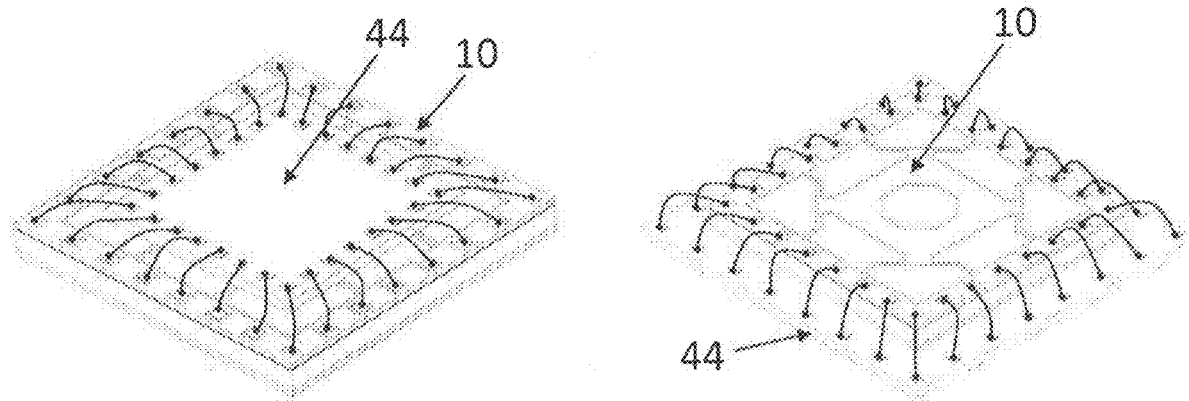
FIG. 25A is a perspective view of a MEMS motion sensor, shown with a CMOS IC stacked on its top cap wafer, and electrically bonded to it with wire bonds.
FIG. 25B is a perspective view of a MEMS motion sensor, stacked on a CMOS IC and electrically bonded to it with wire bonds.
Figure 25C:
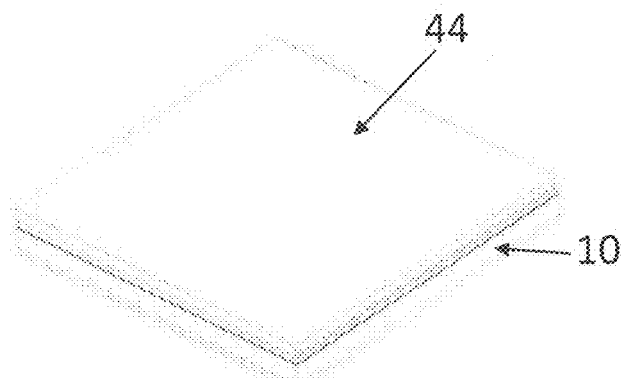
FIG. 25C is a perspective view of a CMOS IC flip-chip bonded to a MEMS motion sensor.

Referring to FIGS. 25A-25C, since the bond pads are on the first or top side of the MEMS motion sensor, the described 3DTCV architecture provides the packaging flexibility of a 2D chip (such as comb-sensors) for 3D MEMS motion sensor and is compatible with CMOS circuitry for sensing and driving the proof mass via electrical signals. The MEMS motion sensor 10 can for example be mounted side-by-side with, and wire bonded to, the sensing IC 44.

A possible embodiment of a completed IMU is shown in 25C. At this point in the process the MEMS IMU wafer is still in wafer form. For wafer scale system packaging, the I/O bond pads of the MEMS IMU and feedthroughs are designed to match the I/O pads of the sense electronics IC. The sense electronics IC wafer 44 can then be flip chip bonded directly to the top of the MEMS IMU wafer using an underfill and solder-bump wafer bonding process. These wafer bonding processes are known in the semiconductor industry and any can be used by implementing the appropriate bond pad and solder metallurgies. The bonded wafers can be diced into chips, or "MEMS IMU cubes". The diced and hermetically sealed IMU cubes can be treated as packaged chips ready to be solder-attached to other chips, multi-chip package, or PC (printed circuit) board.

The benefits of this approach are:

1) The MEMS motion sensor and IC can be matched in size with the bond pad layout so that at singulation, no IC bond pads extend outward beyond the extent of the MEMS chip and the MEMS chip does not have to include any wasted area that is cut away to expose the bond pads. Both the MEMS sensor and IC wafers can be used more efficiently. This enables true MEMS/IC wafer scale packaging since dicing results in usable packaged devices.

2) Bond wires are eliminated between the MEMS and the IC and between the IMU system and the processing electronics. This eliminates stray inductance and capacitance that can affect measurements, as well as the additional cost of wire bonding.

3) No Through Silicon Vias (TSVs) are required in the IC wafer. This reduces IC costs by eliminating the additional processes required at the IC foundry to produce TSVs, eliminates the IC space required for the TSVs, and opens up sourcing for the IC wafers since many IC foundries do not have TSV capabilities.

4) The 3DTCV architecture enables through-MEMS-chip IC Input/Output without adding any additional TSV processes beyond those already used to fabricate the MEMS IMU itself. The only additional process steps are the contact etch and bond pad metallization required for the bottom cap.

The figures illustrate only an exemplary embodiment of the invention and are therefore not to be considered limiting of its scope, as the invention may admit to other equally effective or equivalent embodiments. The scope of the claims should not be limited by the preferred embodiments set forth in the examples, but should be given the broadest interpretation consistent with the description as a whole.

The invention claimed is:

1. A MEMS motion sensor comprising:
an electrically conductive MEMS silicon-on-insulator (SOI) wafer including an insulating layer separating a device layer from a handle layer, the MEMS SOI wafer having a first side and a second side and including an outer frame, a proof mass and a plurality of flexible springs suspending the proof mass relative to the outer frame and enabling the proof mass to move relative to the outer frame along mutually orthogonal x, y and z axes, the plurality of springs formed in the device layer;
an electrically conductive silicon top cap wafer and an electrically conductive silicon bottom cap wafer respectively bonded to the first side and the second side of the MEMS SOI wafer such that the top cap wafer, the bottom cap wafer and the outer frame of the MEMS SOI wafer define a cavity for housing the proof mass;
a plurality of top cap wafer electrodes and a plurality of bottom cap wafer electrodes that are respectively positioned with the top cap wafer and the bottom cap wafer, the electrodes forming capacitors with the proof mass that are configured to detect at least one of translational and rotational motion of the proof mass, wherein a detected rotational motion includes an angular motion of the proof mass about at least one of the x, y, and z axes;
a plurality of insulated conducting pathways, each insulated conducting pathway conducting signals through at least a portion of each of the silicon top cap wafer, the MEMS SOI wafer, and the silicon bottom cap wafer; and
a first set of electrical contacts on a top surface of the top cap wafer and connected to the plurality of top cap wafer electrodes, a second set of electrical contacts on the top surface of the top cap wafer being connected to the bottom cap wafer electrodes via at least one of the plurality of insulated conducting pathways, and a third set of electrical contacts connected to the proof mass.

2. The MEMS motion sensor according to claim 1, wherein the proof mass and flexible springs form a resonant structure having resonant frequencies fx, fy and fz for motion along the x, y and z axes, respectively.

3. The MEMS motion sensor according to claim 2, comprising electrode assemblies, each including at least one pair of said top cap electrodes, or at least one pair of said bottom cap electrodes or a combination of said top cap electrodes and bottom cap electrodes, said electrode assemblies comprising:
- a first electrode assembly configured to detect a rocking motion of the proof mass about the y axis, indicative of an acceleration of the proof mass along the x axis;
- a second electrode assembly configured to detect a rocking motion of the proof mass about the x axis, indicative of an acceleration of the proof mass along the y axis; and
- a third electrode assembly configured to detect a translational motion of the proof mass along the z axis, indicative of an acceleration of the proof mass along the z axis.

4. The MEMS motion sensor according to claim 3, wherein one of the electrode assemblies is connectable to a drive circuit configured to vibrate the proof mass at a drive frequency along the z axis, and two other of the electrode assemblies are configured to detect Coriolis-induced oscillations of the proof mass along the x and y axes, indicative of an angular motion of the proof mass about the y and x axes, respectively.

5. The MEMS motion sensor according to claim 4, wherein the drive frequency corresponds to the resonant frequency fz.

6. The MEMS motion sensor according to claim 4, wherein the resonant frequency fz is substantially identical to each of the respective resonant frequencies fx, fy, in order to provide matched resonance conditions.

7. The MEMS motion sensor according to claim 4, wherein a relative difference between any two of the resonant frequencies fz, fx, fy is no more than 10%.

8. The MEMS motion sensor according to claim 4, wherein the drive frequency is lower than at least one of the respective resonant frequencies fx and fy.

9. The MEMS motion sensor according to claim 4, wherein the drive frequency is 10-40% lower than each of the respective resonant frequencies fx and fy.

10. The MEMS motion sensor according to claim 3, wherein one of the electrode assemblies is configured to vibrate the proof mass at a drive frequency along a corresponding one of the x and y axes, respectively, and another one of the electrode assemblies is configured to detect Coriolis-induced oscillations of the proof mass along the other one of the x and y axes, indicative of the angular motion of the proof mass about the z axis.

11. The MEMS motion sensor according to claim 10, wherein the drive frequency along the corresponding one of the x and y axes corresponds to a respective one of the resonant frequencies fx and fy.

12. The MEMS motion sensor according to claim 3, wherein the resonant structure is shaped, sized and configured such that each of the resonant frequencies fx, fy and fz is substantially higher than sensing frequencies at which the electrode assemblies are configurable with a sensing circuit to detect the motion of the proof mass in response to accelerations of the proof mass along the x, y and z axes, respectively.

13. The MEMS motion sensor according to claim 1, wherein the flexible springs and the proof mass comprises a resonant structure that is shaped, sized and configured with each of the resonant frequencies fx, fy and fz being substantially different.

14. The MEMS motion sensor according to claim 13, wherein the resonant structure is shaped, sized and configured with the resonant frequencies fx, fy and fz having mutually non-overlapping 3 dB-bandwidths.

15. The MEMS motion sensor according to claim 1, wherein said top and bottom cap electrodes comprise pairs of said top and bottom electrodes that are aligned with the z axis, the electrodes being centered relative to the proof mass.

16. The MEMS motion sensor according to claim 1, wherein said top and bottom cap electrodes comprise two pairs of said top and bottom electrodes disposed along the x axis on each side of the y axis.

17. The MEMS motion sensor according to claim 1, wherein said top cap electrodes and bottom cap electrodes comprise two pairs of said top and bottom electrodes disposed along the y axis on each side of the x axis.

18. The MEMS motion sensor according to claim 1, wherein the proof mass is shaped as a convex polygonal prism.

19. The MEMS motion sensor according to claim 1, wherein the proof mass is shaped as a regular convex polygonal prism.

20. The MEMS motion sensor according to claim 1, wherein the proof mass is shaped as an octagonal prism.

21. The MEMS motion sensor according to claim 1, wherein the flexible springs comprise four flexible springs.

22. The MEMS motion sensor according to claim 1, wherein the top and bottom cap wafers have respective thicknesses, the top cap wafer electrodes and bottom cap wafer electrodes extending through the entire thicknesses of the top and bottom cap wafers, respectively.

23. The MEMS motion sensor according to claim 1, wherein the proof mass comprises an SOI proof mass having a device layer, an insulating layer, and a handle layer, the SOI proof mass having a thickness in a range of 400 to 700 microns.

24. The MEMS motion sensor according to claim 1, wherein at least one of the plurality of insulated conducting pathways extends through the insulating layer with a conducting shunt to connect a corresponding contact of the second set of electrical contacts to a corresponding electrode of the plurality of bottom cap wafer electrodes.

25. The MEMS motion sensor according to claim 1, wherein the proof mass is patterned in both the device and handle layers.

26. The MEMS motion sensor according to claim 1, wherein the top cap wafer electrodes and the bottom cap wafer electrodes are delimited by insulated channels.

27. The MEMS motion sensor according to claim 1, wherein each of the bottom cap wafer and top cap wafer is provided with at least one electrical contact, the MEMS motion sensor comprising an additional insulated conducting pathway extending through the bottom cap wafer, through the MEMS SOI wafer, and through the top cap wafer along the z axis and optionally in an x-y plane, between one of the electrical contacts of the top cap wafer and one of the electrical contacts of the bottom cap wafer, thereby forming a conductive feedthrough.

28. The MEMS motion sensor of claim 1 wherein the first set of contacts, second set of contacts, and third set of contacts are on the top cap wafer.

29. The MEMS motion sensor of claim 1 wherein the first set of contacts, second set of contacts, and third set of contacts are on the bottom cap wafer.

30. The MEMS motion sensor of claim 1 wherein said rotational motion further comprises rotation about the x axis, the y axis, or a combination thereof.

31. The MEMS motion sensor of claim 1 wherein the motion sensor is configured to detect an angular rotation rate about the x axis, the y axis and the z axis.

32. The MEMS motion sensor of claim 1 wherein the proof mass comprises a silicon layer on an insulated substrate, the silicon layer being conductively connected to at least one of the third electrical contacts.

33. The MEMS motion sensor of claim 1 wherein the motion sensor detects at least 3 degrees of freedom of motion of the proof mass about the x axis, the y axis and the z axis.

34. The MEMS motion sensor of claim 33 wherein the top cap wafer has at least five electrodes.

35. The MEMS motion sensor of claim 1 wherein the MEMS SOI wafer, the silicon top cap wafer and the silicon bottom cap wafer each comprise a semiconductor wafer.

36. The MEMS motion sensor of claim 1 wherein the motion sensor comprises a gyroscope.

37. The MEMS motion sensor of claim 1 wherein the proof mass is hermetically sealed within the cavity.

38. The MEMS motion sensor of claim 1 wherein the MEMS SOI wafer is fusion bonded to the silicon top cap wafer and the silicon bottom cap wafer.

39. The MEMS motion sensor of claim 1 wherein the motion sensor comprises an inertial measurement unit (IMU).

40. The MEMS motion sensor of claim 39 wherein the inertial measurement unit (IMU) is mounted to a printed circuit board, the printed circuit board further having an integrated circuit.

41. The MEMS motion sensor of claim 39 wherein the inertial measurement unit (IMU) comprises a first MEMS motion sensor and a second MEMS motion sensor mounted in a multi-chip package that measures 5 or 6 degrees of freedom.

42. The MEMS motion sensor of claim 1 further comprising bottom cap wafer contacts connected to one or more of the electrodes and wherein the third set of electrical contacts are on the top surface of the top cap wafer.

43. A MEMS motion sensor comprising:
an electrically conductive MEMS silicon-on-insulator (SOI) wafer having a first side and a second side and including an outer frame, a proof mass and a spring suspending the proof mass relative to the outer frame and enabling the proof mass to move relative to the outer frame along at least one axis, the proof mass including a device layer, an insulating layer and a handle layer, the spring formed in the device layer;
an electrically conductive silicon top cap wafer and an electrically conductive silicon bottom cap wafer respectively bonded to the first side and the second side of the MEMS SOI wafer such that the top cap wafer, the bottom cap wafer and the outer frame of the MEMS SOI wafer define a cavity for housing the proof mass;
at least one top cap wafer electrode, the at least one top cap wafer electrode detecting at least one of translational and rotational motion of the proof mass; and
a first electrical contact on or above the top cap wafer and connected to the top cap wafer electrode, a second electrical contact connected to the proof mass, and a third electrical contact connected to the bottom cap wafer.

44. The MEMS motion sensor of claim 43 wherein the spring is one of a plurality of flexible springs.

45. The MEMS motion sensor of claim 43, wherein the spring electrically connects the proof mass to the second electrical contact.

46. The MEMS motion sensor of claim 43, wherein at least one of the top cap wafer and the bottom cap wafer includes a trench filled with insulating material.

47. The MEMS motion sensor of claim 43, further comprising at least one insulated conducting pathway that conducts signals between the first electrical contact and the bottom cap wafer wherein the insulating conducting pathway includes an SOI conducting shunt in the MEMS SOI wafer that electrically connects the device layer and the handle layer.

48. The MEMS motion sensor of claim 43, where in the top cap wafer is fusion bonded to the first side of the MEMS SOI wafer and the bottom cap wafer is fusion bonded to the second side of the MEMS SOI wafer.

49. The MEMS motion sensor of claim 43, where in the proof mass has a thickness in a range from 400 to 700 microns.

50. The MEMS motion sensor of claim 43, where in the proof mass has a conducting shunt connecting the device layer and the handle layer.

51. The MEMS motion sensor of claim 43, wherein the MEMS motion sensor is mounted to a printed circuit board to form a chip package, the chip package including an integrated circuit connected to the MEMS motion sensor.

* * * * *